United States Patent [19]

Murooka et al.

[11] Patent Number: 5,614,439
[45] Date of Patent: Mar. 25, 1997

[54] METHOD OF MAKING A PLANAR WIRING IN AN INSULATED GROOVE USING ALKYLALUMINUM HYDRIDE

[75] Inventors: Fumio Murooka; Tetsuo Asaba; Shigeyuki Matsumoto, all of Atsugi; Osamu Ikeda, Tokyo; Toshihiko Ichise, Kawasaki; Yukihiko Sakashita, Isehara; Shunsuke Inoue, Atsugi, all of Japan

[73] Assignee: Canon Kabushiki Kaisha, Tokyo, Japan

[21] Appl. No.: 393,928

[22] Filed: Feb. 21, 1995

Related U.S. Application Data

[62] Division of Ser. No. 259,125, Jun. 13, 1994, abandoned, which is a continuation of Ser. No. 705,597, May 24, 1991, abandoned.

[30] Foreign Application Priority Data

| May 31, 1990 | [JP] | Japan | 2-139616 |
| May 31, 1990 | [JP] | Japan | 2-139620 |
| May 31, 1990 | [JP] | Japan | 2-139621 |

[51] Int. Cl.⁶ .................................................. H01L 21/44
[52] U.S. Cl. .................. 437/194; 437/190; 437/195; 437/197; 148/DIG. 50; 257/758; 257/760; 257/765; 257/767
[58] Field of Search ............................ 357/71; 257/665, 257/758, 760, 761, 767; 437/194, 197, 195; 148/DIG. 50

[56] References Cited

U.S. PATENT DOCUMENTS

| 4,375,717 | 3/1983 | Tonnel | 437/194 |
| 4,538,344 | 9/1985 | Okumura et al. | 437/194 |
| 4,977,105 | 12/1990 | Okamoto et al. | 437/194 |
| 5,040,049 | 8/1991 | Raaijmakers | 257/758 |
| 5,049,969 | 9/1991 | Orbach et al. | 357/71 |
| 5,049,980 | 9/1991 | Saito et al. | 357/71 |
| 5,060,029 | 10/1991 | Nishizawa et al. | 357/71 |
| 5,063,433 | 11/1991 | Matsuo et al. | 357/71 |
| 5,084,413 | 1/1992 | Fujita et al. | 437/189 |
| 5,126,825 | 6/1992 | Harada | 357/71 |

(List continued on next page.)

FOREIGN PATENT DOCUMENTS

| 0288767 | 11/1988 | European Pat. Off. . |
| 0333132 | 9/1989 | European Pat. Off. . |
| 0353426 | 2/1990 | European Pat. Off. . |
| 0420594A3 | 9/1991 | European Pat. Off. . |
| 63-275142 | 11/1988 | Japan . |
| 1194440 | 8/1989 | Japan . |
| 1248643 | 10/1989 | Japan . |

OTHER PUBLICATIONS

H. Pierson, Aluminum Coatings by the Decomposition of Alkyls, Thin Solid Films vol. 45, 1977, Netherlands, at pp. 257–263.

App. Phys. Let., vol. 57, No. 12, Sep. 17, 1990, pp. 1221–1223, Tsubouchi et al., "Complete Planarization etc.".

Jp. J. Appl. Phys, Suppl. 21st Conf., 1989, pp. 29–32, Sekiguchi et al. "Epitaxial Growth of Al (100) etc.".

IEEE Frans. Comp. Hyb. & Manuf. Tech, vol. 10, No. 3, Sep. 1967, pp. 314–320, Kwon et al. "Closely packed Microstrip Lines etc.".

*Primary Examiner*—Tom Thomas
*Assistant Examiner*—Lynne A. Gurley
*Attorney, Agent, or Firm*—Fitzpatrick, Cella, Harper & Scinto

[57] ABSTRACT

A semiconductor device with a high-density wiring structure, and a producing method for such device are provided. The semiconductor device has a substrate such as silicon, an insulation layer laminated on the substrate and having a groove or a hole, and a wiring of a conductive material formed in the groove or hole in the insulation layer. The wiring is formed by depositing a conductive material such as aluminum or an aluminum alloy in the groove or hole of the insulation layer by a CVD method utilizing alkylaluminum hydride gas and hydrogen. The groove or hole can be formed by an ordinary patterning method combined with etching.

13 Claims, 15 Drawing Sheets

U.S. PATENT DOCUMENTS

| | | | |
|---|---|---|---|
| 5,132,774 | 7/1992 | Matsuura et al. | 257/758 |
| 5,173,442 | 12/1992 | Carey | 437/194 |
| 5,179,042 | 1/1993 | Mikoshiba et al. | 437/187 |
| 5,180,687 | 1/1993 | Mikoshiba et al. | 437/194 |
| 5,210,053 | 5/1993 | Yamagata | 437/194 |
| 5,279,988 | 1/1994 | Saadat et al. | 437/194 |
| 5,286,674 | 2/1994 | Roth et al. | 437/194 |
| 5,316,972 | 5/1994 | Mikoshiba et al. | 437/194 |
| 5,328,873 | 7/1994 | Mikoshiba et al. | 437/187 |

METHOD OF MAKING A PLANAR WIRING IN AN INSULATED GROOVE USING ALKYLALUMINUM HYDRIDE

This application is a division, of application Ser. No. 08/259,125 filed Jun. 13, 1994, which was a continuation of application Ser. No. 07/705,597, filed May 24, 1991, both now abandoned.

BACKGROUND OF THE INVENTION

1. Field of the Invention

The present invention relates to a semiconductor device, and more particularly to a semiconductor device with a flattened wiring structure of an elevated wiring density, a semiconductor device with a coaxial wiring structure, a method for producing such semiconductor devices, a method of forming contact between a semiconductor electrode and a silicon substrate, and a method of forming a through-hole in a multi-layered wiring structure.

2. Related Background Art

Initially the following is an explanation of the method of producing a conventional example of a semiconductor device, with reference to FIGS. 1B and 1A, which are respectively a plan view of the semiconductor device and a cross-sectional view along a line A—A' in FIG. 1B.

On a semiconductor substrate 55 already bearing functional elements thereon, BPSG (boron phosphosilicate glass) or PSG (phosphosilicate glass) is deposited with a thickness of 6000–8000 Å for example by CVD to form a first insulation layer 53. Then contact holes 56, for connecting the semiconductor substrate 55 with first wirings 51, are opened by patterning. The etching in this operation is usually conducted with a mixture of fluorine gas and chlorinated gas, anisotropically in the direction of depth.

Then Al (or an Al alloy) is deposited with a thickness of 0.6–1 μm over the entire surface, for example by magnetron sputtering, and an etching operation with Cl-containing etching gas is conducted to form the first Al wiring layer 51 into desired patterns. Subsequently PSG, or a silicon nitride film formed by plasma CVD, is deposited over the entire surface, thereby obtaining an insulation layer 54 of a thickness of 5000–8000 Å.

Subsequently through-holes 57 are opened by patterning of photoresist and etching with a fluorine/chlorine-containing gaseous mixture. Then aluminum is deposited with a thickness of ca. 0.8–1.2 μm over the entire surface again with the magnetron sputtering apparatus, and second wirings 52 are formed with a desired pattern to obtain the semiconductor device as shown in FIGS. 1A and 1B.

It is generally difficult to position the through-hole 57 strictly above the contact hole 56, as shown in FIG. 1A, because the surface shows significant steps in the vicinity of the contact hole due to the stepped structure therein, so that the through-hole 57 positioned above may not be opened completely or the upper second wiring 52 may be unable to sufficiently cover a step of significant size and may become disconnected.

Also the wiring pattern has to be made with a size overlapping by a certain margin, to the periphery of the contact hole 56, in order that the contact hole 56 is securely covered by the first wiring 51. If the margin is not enough, the aluminum in the contact hole may also be etched in the aluminum etching operation, whereby serious troubles may arise in the contact resistance and in the surface insulation characteristic. A similar situation applies also to the relation between the pattern of the through-hole 57 and the second wiring 52.

Because of the above-mentioned reasons, the wiring area can only be reduced to a certain limit, and the chip size cannot be reduced significantly, with the surface steps therein, in spite of the miniaturization of the constituent elements The following is an explanation of the producing method of a second conventional example of the semiconductor device, with reference to FIGS. 2B and 2A, which are respectively a plan view of the device and a cross-sectional view along a line A—A' in FIG. 2B.

The method for producing this semiconductor device is similar to that of the first conventional example except for the presence or absence of holes. As FIG. 2A shows only a cross section of twisted pair lines constituting an inductance, a contact hole between a first wiring 71 and a first insulation layer 73 consisting of silicon is not illustrated. In FIG. 2A, the dimensions L1, L2 and L3 are respectively 0.8, 1.4 and 1.0 μm. Also in FIG. 2B, the dimensions L4, L5, L6 and L7 are respectively 3.0, 4.8, 3.0 and 1.0 μm. Since an alignment error in the photolithography results in serious troubles in the connection and reliability of the contacts and the through-holes 76 as in the first conventional example, the dimension of the first and second wirings 71, 72 has to be considerably larger than that of the through-holes 76 (1.4 μm) as shown in FIG. 2B, so that a high level of integration is very difficult to achieve.

Now, the following is an explanation of the method of forming contact between a semiconductor electrode and a silicon substrate, and forming a through-hole in a multi-layered wiring structure in the conventional semiconductor devices, with reference to FIGS. 3 to 6.

FIG. 3 is a cross-sectional view of a structure in which a through-hole TH101 is formed, above a field oxide film 104, in order to connect a first aluminum layer 101 and a second aluminum layer 102. 103 indicates a silicon substrate, and 104 and 105 are $SiO_2$ films.

In such case, the through-holes can be formed with a minimum size, but such structure is an obstacle to the high level of integration since the connection to the first aluminum layer 101 has to be connected through and overlying field oxide film 106.

FIG. 4 is a cross-sectional view of a through-hole TH102 formed in a relatively thin oxide film 107, instead of the field oxide film. 108 indicates a $SiO_2$ film. As indicated by dimensions L1, L2, L3, L4, L5 and L6 respectively of 0.4, 0.8, 0.8, 1.6, 0.8 and 4.2 μm, the through-hole has to be sized larger for ensuring a proper aperture for the photolithography because of the height relationship is different from that for the through-hole in the field oxide film. Also the connection to the first aluminum layer has to be established as in the structure shown in FIG. 3.

FIGS. 5 and 6 are cross-sectional views of a through-hole formed on a contact by a first Al layer 101 to the silicon substrate, wherein 109 and 110 indicate $SiO_2$ films. In FIG. 6, dimensions L7, L8, L9, L10, L11 and L12 are respectively 0.4, 0.8, 0.8, 0.8, 0.4 and 3.2 μm.

In FIG. 5 the through-hole TH103 is larger than the contact hole CH103, while in FIG. 6, the through-hole TH104 is smaller than the contact hole CH104.

In either case a proper hole opening has to be secured by employing different sizes for the contact and through-holes, thereby utilizing a relatively flat area for forming the through-hole.

FIGS. 7A and 7B show a coaxial wiring achieved by a conventional three-layer Al wiring technology, wherein FIG. 7A is a schematic cross-sectional view of the coaxial wiring structure, while FIG. 7B is a plan view thereof. A second aluminum layer 202 is used as a signal line, while a first aluminum layer 201 and a third aluminum layer 203 are used as shield wires and are mutually connected through first through-holes 209, second aluminum layers 202 and second through-holes 210. 204 indicates a SiO₂ substrate. The first aluminum layer 201 and the third aluminum layer 203 are connected to an electrically stable potential (ground potential). In FIG. 7A, dimensions L1, L2, L3 and L4 are respectively 3.2 or 4.2, 1.0, 1.5 and 6.7 or 7.7 μm.

A multi-layered wiring structure as shown in FIGS. 1A, 1B, 2A and 2B, obtained by a conventional multi-layered wiring technology, has been associated with the following drawbacks to be resolved.

The multi-layered wiring structure, intended for increasing the wiring density, has been obtained by laminating an insulation layer (a silicon oxide film) on a first wiring layer, then forming a second wiring layer, and repeating the above-mentioned operations for third and subsequent wiring layers. Thus the structure of wiring is defined by the disconnection or migration of the wirings resulting from surface steps and the form of contact and through holes required for connection through the insulation layer, so that the increase in wiring density has been limited.

For example the contact hole and the first through-hole, or the first through-hole and the second through-hole, have to be mutually displaced, and a sufficient line/space width has to be provided against wiring disconnection or migration resulting from the surface steps.

In the conventional semiconductor devices as shown in FIGS. 3 to 6, there are required very large areas for contact between the semiconductor electrode and the silicon substrate and for the through-hole for connecting the first and second aluminum layers, in order to obtain a sufficiently large flat area, so that a high level of integration has been difficult to achieve. Also wirings with three or more layers have been difficult to realize as the flattening of the entire layer has not be achieved.

Also in the conventional coaxial wiring structure as shown in FIGS. 7A and 7B, in which the shield is composed of the first Al layer 201, first through-hole 209, second Al layer 202, second through-hole 210 and third Al layer 203, the first through hole 209 and the second through-hole 210 have to be formed by patterning the second Al layer 202 as shown in FIG. 7B and have to be mutually displaced.

Also the first Al layer 201, first through-hole 209, second Al layer 202, second through-hole 210 and third Al layer 203 have to so constructed, as shown in FIG. 8, to satisfy a specific relationship [diameter of first through-hole 209]< [diameter of second through-hole 210].

As will be understood from FIGS. 7A, 7B and 8, in the conventional coaxial wiring structure, as the form of the second Al layer 202 is determined by the shapes of the first and second through-holes 209, 210, the density of the signal lines is governed by the shield lines composed of the second Al layer 202.

SUMMARY OF THE INVENTION

In order to resolve the technical drawbacks mentioned above, the object of the present invention is to provide a semiconductor device with an increased wiring density, a semiconductor device enabling aluminum wirings of three or more layers by reducing the area required in the multi-layered aluminum wirings and flattening the surface of each layer, a semiconductor device enabling a coaxial wiring structure of an increased level of integration, and a method for producing such semiconductor devices.

The above-mentioned object can be attained, according to the present invention, by a semiconductor device provided with a substrate, an insulation layer laminated on the substrate and provided with a groove, and a conductive material provided in the groove and constituting a wiring.

Also the above-mentioned object can be attained, according to the present invention, by a method for producing a semiconductor device, comprising the steps of forming an insulation layer on a substrate, forming a groove in the insulation layer according to the wiring pattern, and selectively depositing a conductive material in the groove thereby completing the wiring. The conductive material may be deposited by a CVD method utilizing alkylaluminum hydride gas and hydrogen.

Also the semiconductor device of the present invention, provided with a multi-layered wiring structure including a first insulation film covering a substrate, a first wiring layer formed on the first insulation film, a second insulation film so formed as to cover the first wiring layer, and a second wiring layer formed on the second insulation film, has a connection member, penetrating the first and second insulation films for electrically connecting the second wiring layer with said substrate surface, which is composed of monocrystalline aluminum.

The method of the present invention, for forming a semiconductor device provided with a multi-layered wiring structure including a first insulation film covering a substrate surface, a first wiring layer formed on the first insulation film, a second insulation film so formed as to cover the first wiring layer, and a second wiring layer formed on the second insulation film, includes the steps of forming an aperture penetrating the first and second insulation film thereby exposing the substrate surface, and depositing aluminum or a metal principally composed of aluminum (in this disclosure, the foregoing phrase is used to refer generally to methods comprising aluminum) in the aperture by a CVD method utilizing alkylaluminum hydride gas and hydrogen thereby forming a connection member connecting the substrate surface with the second wiring layer, Also the semiconductor device of the present invention has an one feature a structure comprising a first metal layer deposited on a first insulation layer, a second insulation layer laminated on said first metal layer and provided with first holes reaching said first metal layer and formed at a predetermined interval, a second metal layer deposited on the second insulation layer with a predetermined distance to the first holes, a third insulation layer laminated on the second insulation layer and on the second metal layer and provided with second holes communicating with the first hole, a metal layer provided in the first and second holes and having flat lateral faces, and a third metal layer deposited on the metal layer with flat lateral faces and on the third insulation layer, wherein the second metal layer is surrounded by the first metal layer, the third metal layer and the metal layer with flat lateral faces.

Also the semiconductor device producing method of the present invention includes a step for depositing a first insulation layer on a substrate surface, a step for depositing a first metal layer on the first insulation layer, a step for depositing a second insulation layer on the first metal layer, a step for depositing a second metal layer on the second insulation layer, a step for patterning the second metal layer into a predetermined shape, a step for depositing a third insulation layer on the surface of the second insulation layer and the second metal layer, a step for forming holes, having a predetermined distance to the second metal layer and reaching the first metal layer, in said second and third insulation layers, a step for depositing aluminum or a metal principally composed of aluminum in the holes by a CVD method utilizing alkylaluminum hydride and hydrogen, and a step for depositing a metal on the surface of the third insulation layer.

The present invention enables a higher density in the wirings and achieves a higher level of integration in the semiconductor device, by forming a groove or an aperture in a silicon oxide film and forming a wiring therein by means of the Al-CVD method to be explained later.

Also the present invention enables a higher density in the wirings, by forming twisted pair lines by the Al-CVD method. The twisted pair lines are made more effective, since the inductance L per line is represented by $L=(Us/2 + 2 Log_e D/r) \times 10^{31}$ $^7$ [H/m]. Also a high integration level can be attained in case the twisted pair lines are formed on a chip.

Furthermore the present invention can 10 reduce the area required for multi-layered wirings, by forming a through-hole through plural laminated layers and filling said hole with mono-crystalline aluminum grown by a CVD method utilizing alkylaluminum hydride and hydrogen.

Furthermore, the present invention allows to use the second Al layer solely for the signal lines, by employing the Al-CVD method for the shield wirings, thereby forming the signal lines with an increased density and enabling a higher integration level in case of forming a coaxial wiring on the chip.

BRIEF DESCRIPTION OF THE DRAWINGS

FIGS. 20A to 20H are views showing the steps for producing the semiconductor device shown in FIGS. 19A and 19B.

DETAILED DESCRIPTION OF THE PREFERRED EMBODIMENTS

In a preferred embodiment of the present invention, there is provided a semiconductor device having a wiring layer on an insulation layer, wherein the wiring layer is buried in recesses formed corresponding to said wiring layer, whereby the upper surface of the wiring layer and that of the insulation layer constitute a substantially flat surface. Also a multi-layered wiring structure with extremely little surface irregularity can be easily obtained by laminating the wiring layers of the above-explained structure, forming apertures in the insulation film present therebetween and connecting the upper and lower wiring layers through the apertures.

Particularly when connecting the mutually crossing two wiring layers positioned above and below, the recess can be formed as a penetrating part, which functions the same as the aperture at the crossing of the wirings and can obviate the formation of the contact hole.

More specifically, in the upper wiring layer, the insulation in the lateral direction is ensured by the insulation film bearing recesses (penetrating portions), and the insulation at the bottom is given by the upper surface of the underlying insulating film.

The conductive material for wiring formation may be composed of polycrystalline silicon, or a metal such as Al, W, Mo, Cu or Ta or an alloy principally composed of these metals, but particularly preferred is aluminum or a metal material principally composed of aluminum, which can reproducibly provide a film of satisfactory quality by the Al-CVD method.

Also in a preferred embodiment of the present invention, there is provided a method for producing a semiconductor device, adapted for use in formation of wirings of a layer of multiple layers in grooves, formation of through-holes for connecting the wirings of different layers, and formation of contact holes for connecting the wirings with a semiconductor element, by means of selective deposition of a conductive metallic material.

Figure 9A:
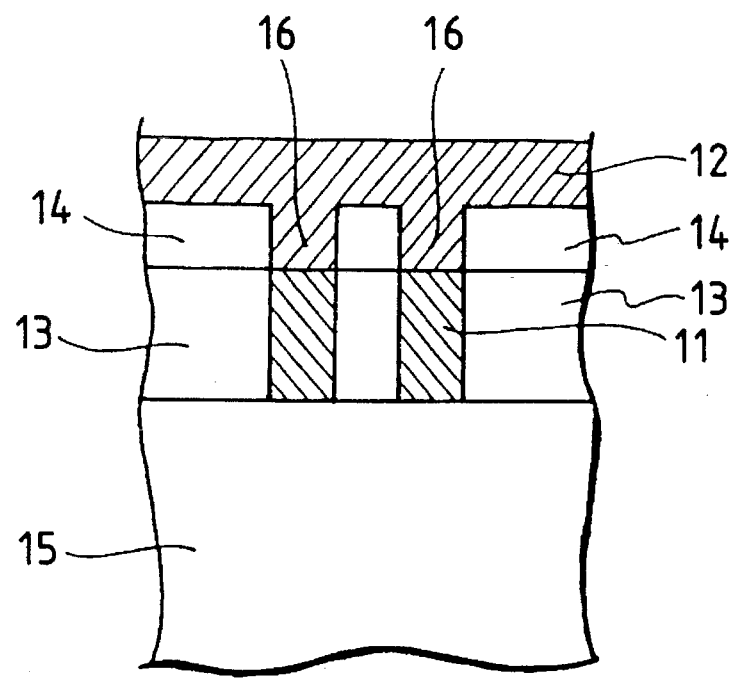
FIGS. 9A and 9B are schematic views of a first embodiment of the present invention.
Figure 9B:
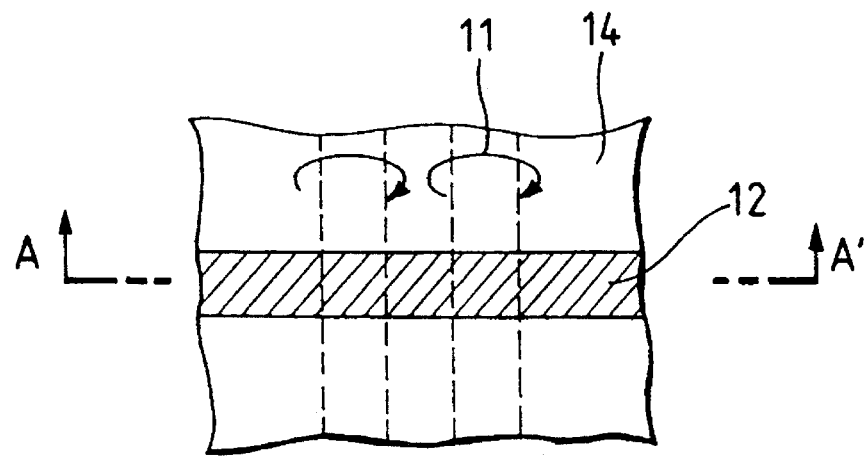

FIG. 9B is a schematic plan view showing a wiring obtained by the Al-CVD method and representing the feature of the present invention, and FIG. 9A is a schematic cross-sectional view along a line A—A' in FIG. 9B.

In a first insulation layer 13 of silicon oxide, formed on the surface of a semiconductor substrate 15 having functional elements such as transistors therein, apertures for making connection with the semiconductor substrate and a groove corresponding to the wiring pattern are formed and filled with aluminum or a metal principally composed of aluminum by means of the Al-CVD method, thereby forming contact portions and a first wiring portion, as represented by 11. After thus are formed a second wiring 12 on a second insulation layer 14 and apertures 16 penetrating the first insulation layer 13 and the second insulation layer 14 if contacts are to be made with the semiconductor substrate 15, and the apertures are filled by the Al-CVD method. For use as a wiring, aluminum or a metal principally composed of aluminum is deposited by the Al-CVD method in a groove not penetrating the first insulation layer 13.

Also when forming a second wiring 12 to the first wirings 11 formed in the first insulation layer 13, apertures and a groove are similarly formed in the second insulation layer 14 of silicon oxide, and the Al-CVD method is executed.

A multi-layered wiring structure can be obtained by executing the above-explained operations for each insulation layer.

The wirings may also be obtained by selectively depositing a metal by the Al-CVD method in the apertures for making contacts between the upper and lower wiring layers, then depositing a metal over the entire surface including the grooves, and eliminating the metal by etching, excluding the groove areas. However the Al-CVD method allows simpler wiring formation, because, in such grooves and apertures, the electron non-donating surface of the insulation layer is modified into an electron donating surface by the damage at the formation of such grooves or apertures.

Thus aluminum or a metal principally composed of aluminum can be selectively deposited in the grooves of the wiring pattern and in the apertures.

The following is a detailed explanation on the Al-CVD method. A further process includes depositing a metal in the apertures by the Al-CVD method and then depositing a metal on the entire surface by sputtering, but wiring formation solely by the Al-CVD method is more preferable as explained above. The following description may be helpful in understanding the excellent selectivity of the Al-CVD method, and the satisfactory quality of the obtained film as the material for electrodes and wirings.

Film forming method

The following is an explanation of a film forming method adapted for use in the formation of electrodes according to the present invention.

This method is adapted for filling an aperture with a conductive material, for forming the electrode of the above-explained structure.

This film forming method consists of forming a deposited film by a surface reaction on an electron donating substrate, utilizing alkylaluminum hydride gas and hydrogen gas (this method being hereinafter called Al-CVD method).

An aluminum film of satisfactory quality can be deposited by heating the surface of the substrate in the presence of a gaseous mixture particularly consisting of monomethylaluminum hydride (MMAH) or dimethylaluminum hydride (DMAH) as the raw material gas and hydrogen as the reaction gas. At the selective Al deposition, the substrate surface is preferably maintained at a temperature at least equal to the decomposition temperature of alkylaluminum hydride but lower than 450° C., more preferably between 260° C. and 440° C., by direct or indirect heating.

The heating of the substrate in the above-mentioned temperature range may be achieved by direct or indirect heating, but formation of an Al film of satisfactory quality can be achieved with a high deposition speed, particularly by direct heating. For example, with the more preferred temperature range of 260°–440° C., a satisfactory film can be obtained with a deposition speed of 300–5000 Å/min. which is higher than in the resistance heating. Such direct heating (substrate being heated by direct transmission of energy from the heating means) can be achieved by heating with a lamp such as a halogen lamp or a xenon lamp. Also indirect heating may be achieved for example by resistance heating, conducted by a heat generating member provided in a substrate support member, for supporting the substrate to be subjected to film deposition, provided in a film depositing space.

This method, if applied to a substrate having both an electron donating surface area and an electron non-donating surface area, allows the formation of a single crystal of aluminum with satisfactory selectivity solely on the electron donating surface area. Such aluminum is excellent in all the properties required for the electrode/wiring material, including a low hillock frequency and a low alloy spike frequency.

This is presumably because the semiconductive or conductive surface consistuting an electron donating surface can selectively develop an aluminum film of satisfactory quality and excellent crystalline character of said Al film that excludes or significantly reduces the alloy spike formation etc. resulting from an eutectic reaction with the underlying silicon. Such an Al film, when employed as an electrode of a semiconductor device, provides advantages far exceeding the concept of the conventional Al electrode and not anticipated in the prior technology.

As explained above, the Al deposited in an aperture with an electron donating surface, for example an aperture formed in an insulating film and exposing the surface of a semiconductor substrate therein, has a monocrystalline structure. Besides the Al-CVD method can achieve selective deposition of the following metal films principally composed of aluminum, with likewise satisfactory quality.

For example, the electrode may be formed by selective deposition of various conductive materials such as Al-Si, Al-Ti, Al-Cu, Al-Si-Ti or Al-Si-Cu by the use of a mixed gaseous atmosphere employing, in addition to alkylaluminum hydride gas and hydrogen, a suitable combination of:

Si-containing gas such as $SiH_4$, $Si_2H_6$, $Si_3H_8$, $Si(CH_3)_4$, $SiCl_4$, $SiH_2Cl_2$ or $SiHCl_3$;

Ti-containing gas such as $TiCl_4$, $TiBr_4$ or $Ti(CH_3)_4$; and/or

Cu-containing gas such as copper bisacetylacetonate $Cu(C_5H_7O_2)_2$, copper bisdipyvaloylmethanite $Cu(C_{11}H_{19}O_2)_2$ or copper bishexafluoroacetylacetonate $Cu(C_5HF_6O_2)_2$.

Also since this Al-CVD method is excellent in selectivity and provides satisfactory surface characteristics on the deposited film, there can be obtained a metal film suitable and widely usable for the wirings of a semiconductor device, by employing a non-selective film forming method in a next deposition step to form a metal film composed solely or principally of aluminum not only on the selectively deposited aluminum film mentioned above but also on the $SiO_2$ insulation film.

Examples of such metal films include combinations of selectively deposited Al, Al-Si, Al-Ti, Al-Cu, Al-Si-Ti or Al-Si-Cu and non-selectively deposited Al, Al-Si, Al-Ti, Al-Cu, Al-Si-Ti or Al-Si-Cu.

The non-selective film deposition may be achieved by CVD other than the aforementioned Al-CVD, or by sputtering.

Film forming apparatus

The following is an explanation of a film forming apparatus suitable for the electrode formation according to the present invention.

Figure 10:
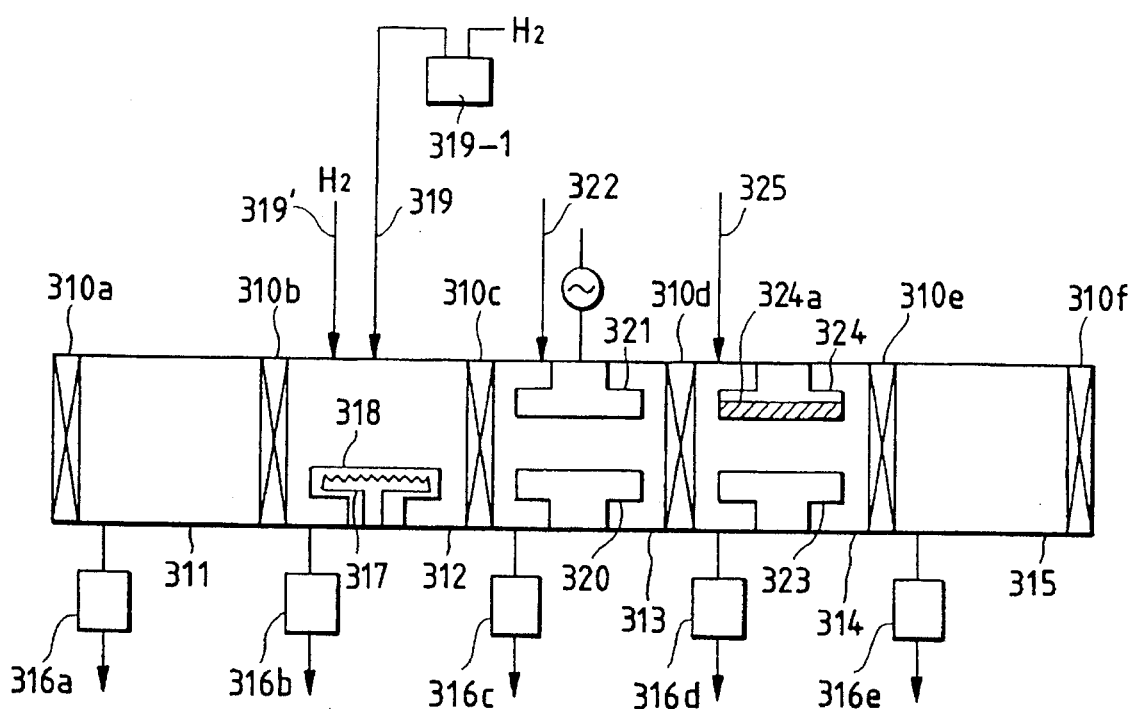
FIGS. 10 to 13 are schematic views of a continuous metal film forming apparatus adapted for use in the film forming method of the present invention.
Figure 11:
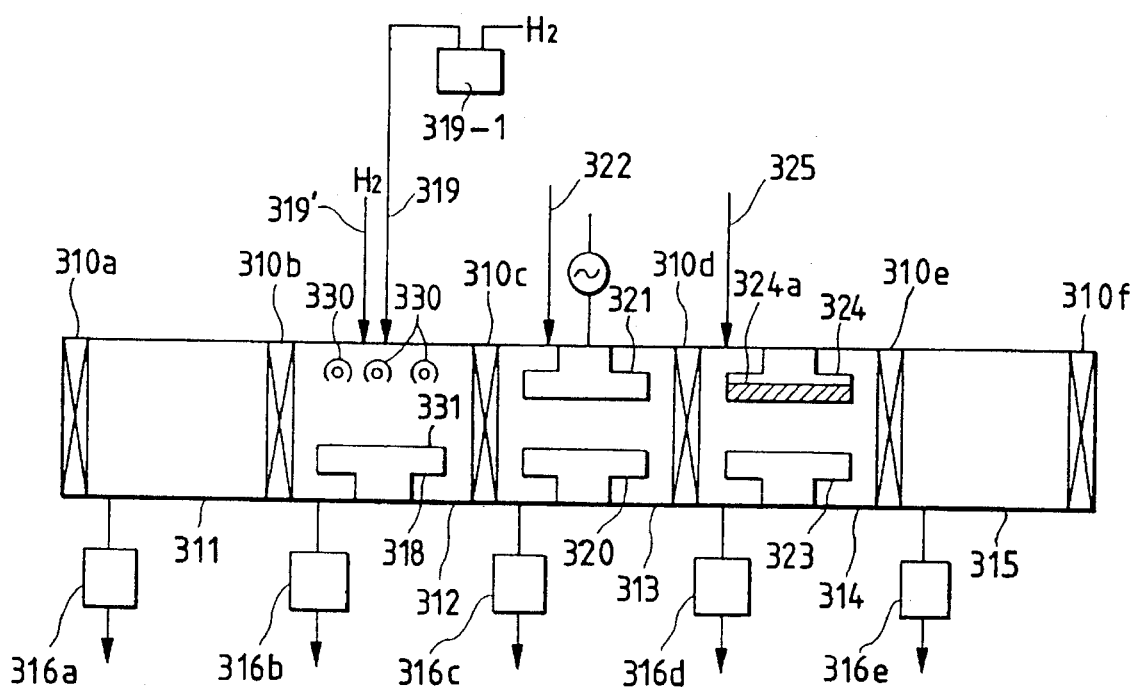
Figure 12:
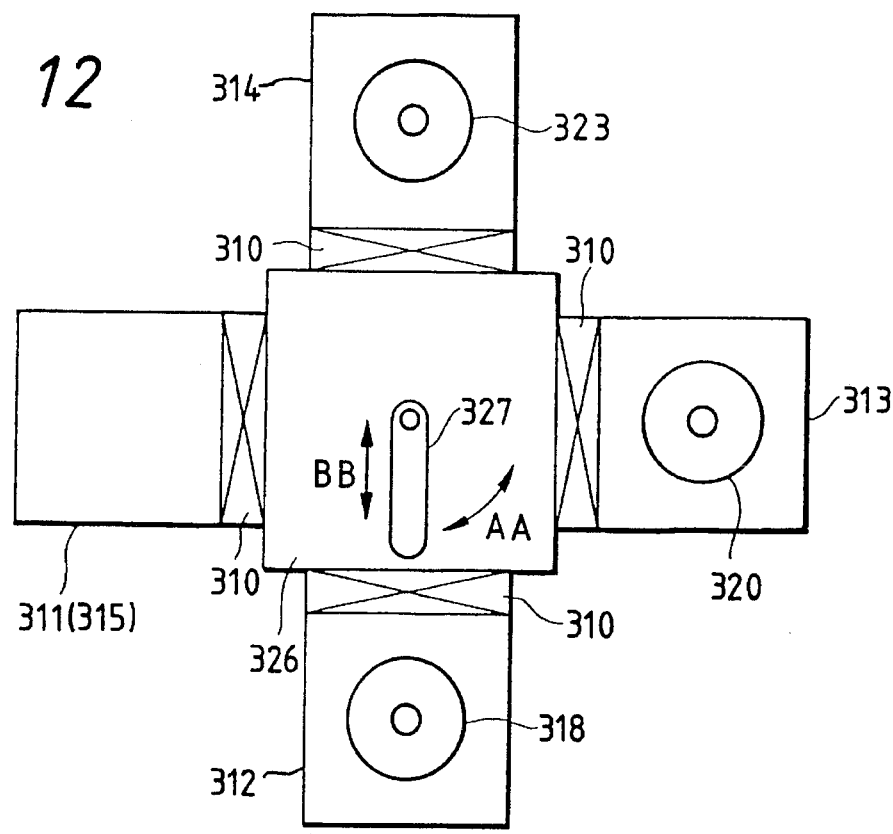
Figure 13:
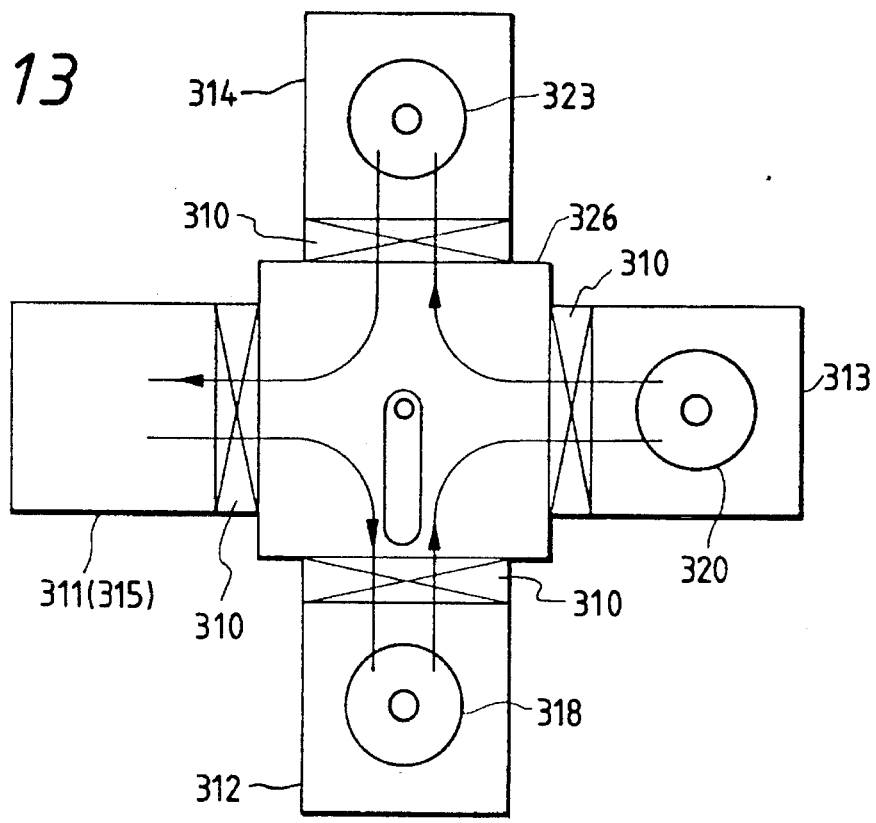

FIGS. 10 to 12 schematically illustrate a continuous metal film forming apparatus suitable for executing the film forming method explained above.

As shown in FIG. 10, the apparatus is composed of a loading chamber 311, a CVD reaction chamber (first film forming chamber) 312, an Rf etching chamber 313, a sputtering chamber (second film forming chamber) 314 and an unloading chamber 315, which are rendered sealable from the external atmosphere and mutually communicatable by means of gate valves 310a–310f and can be respectively made vacuum or reduced in pressure by vacuum systems 316a–316e. The loading chamber 311 is used for eliminating the atmosphere of substrate and replacing it with $H_2$ prior to the deposition, in order to improve the throughput. The next CVD reaction chamber 312, for selective deposition onto the substrate under normal or reduced pressure, is provided therein with a substrate holder 318 with a resistance heater 317 for heating the substrate surface subjected to film formation at least within a temperature range of 200°–450° C., and receives the raw material gas such as of alkylaluminum hydride, which is gasified by bubbling with hydrogen in a bubbler 319-1, through a raw material gas supply line 319, and hydrogen as the reaction gas through a gas line 319'. The Rf etching chamber 313, for cleaning (etching) of the substrate surface in Ar atmosphere after the selective deposition, is provided therein with a substrate holder 320 capable of heating the substrate at least within a range of 100°–250° C. and an Rf etching electrode line 321, and is connected to an Ar gas supply line 322. The sputtering chamber 314, for non-selective deposition of a metal film by sputtering in Ar atmosphere, is provided therein with a substrate holder 323 to be heated at least within a range of 200°–250° C. and a target electrode 324 for mounting a sputtering target 324a, and is connected to an Ar gas supply line 325. The final unloading chamber 315, for adjustment of the substrate after metal film deposition and prior to the exposure to the external atmosphere, is designed to be capable of replacing the atmosphere with $N_2$.

FIG. 11 shows another example of the continuous metal film forming apparatus, wherein same components as those in FIG. 2 are represented by same numbers. The apparatus in FIG. 11 is different from that in FIG. 10 in that the substrate surface is directly heated by halogen lamps 330, and, for this purpose, the substrate holder 312 is provided with projections 331 for supporting the substrate in a floating state.

Direct heating of the substrate surface with such structure further increases the deposition speed as explained before.

Figure 5:
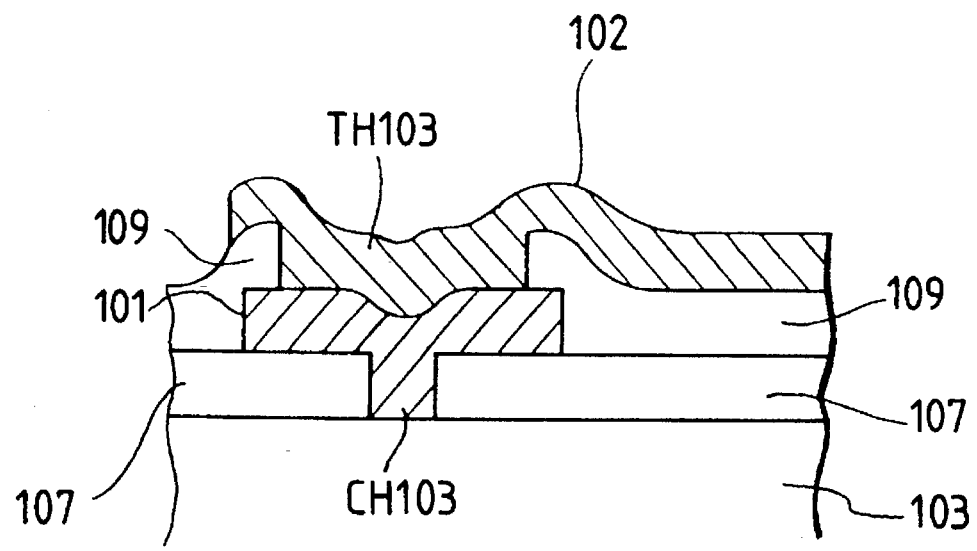

The continuous metal film forming apparatus of the above-explained structure is equivalent, in practice, to a structure shown in FIG. 12, in which the loading chamber 311, CVD reaction chamber 312, Rf etching chamber 313, sputtering chamber 314 and unloading chamber 315 are mutually combined by a transport chamber 326. In this structure, the loading chamber 311 serves also as the chamber 315. In the transport chamber 326, there is provided an arm 327 constituting transport means, rotatable in both directions A—A and extendable and retractable in direction B—B, whereby the substrate can be transferred in succession from the loading chamber 311 to the CVD reaction chamber 312, Rf etching chamber 313, sputtering chamber 314, and finally to the unloading chamber 315 without exposure to the external atmosphere, as indicated by arrows in FIG. 5.

Film forming process

Now the following is an explanation of the film forming process for forming the electrodes and wirings according to the present invention.

FIGS. 14A to 14D illustrate the film forming procedure for forming the electrodes and wirings according to the present invention, in schematic perspective views.

At first the outline of the procedure will be described. A semiconductor substrate with an insulating film having apertures therein is placed in the film forming chamber, and the surface thereof is maintained for example at 260°–450° C. Thermal CVD conducted in a mixed atmosphere of DMAH gas as alkylaluminum hydride and hydrogen gas causes selective deposition of Al on the semiconductor exposed in the apertures. There may naturally be conducted selective deposition of a metal film principally composed of Al, for example Al-Si, by introduction for example of Si-containing gas, as explained before. Then a metal film composed solely or principally of Al is non-selectively formed by sputtering, on the selectively deposited Al and on the insulation film. Subsequently the non-selectively deposited metal film is patterned into the shape of desired wirings, thereby obtaining the electrodes and the wirings.

This procedure will be explained in greater details with reference to FIGS. 11 and 14A to 14D. At first a substrate is prepared, consisting for example of a monocrystalline silicon wafer bearing thereon an insulation film, in which apertures of different sizes are formed.

Figure 14A:
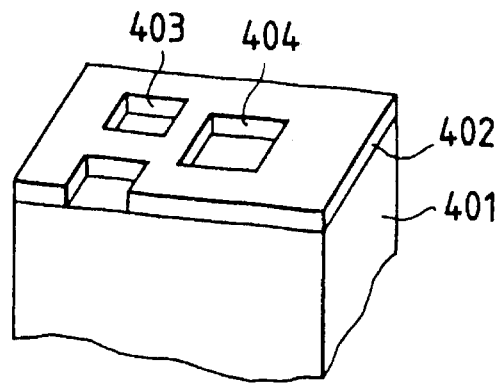
FIGS. 14A to 14D are schematic perspective views showing a film forming procedure of the present invention.

FIG. 14A schematically shows a part of the substrate, wherein are shown a monocrystalline silicon substrate 401 constituting a conductive substrate, a thermal silicon oxide film 402 constituting an insulation film, and apertures 403, 404 of different sizes.

The formation of Al film, constituting a first wiring layer, on the substrate is conducted in the following manner, with the apparatus shown in FIG. 11.

At first the above-explained substrate is placed in the load lock chamber 311, in which a hydrogen atmosphere is established by introduction of hydrogen as explained before. Then the reaction chamber 312 is evacuated by the vacuum system 316b approximately to $1 \times 10^{-8}$ Torr, though Al film formation is still possible with a higher pressure.

Then DMAH gas obtained by bubbling is supplied from the gas line 319, utilizing $H_2$ as the carrier gas.

Also hydrogen as the reaction gas is introduced from the second gas line 319', and the interior of the reaction chamber 312 is maintained at a predetermined pressure, by the adjustment of an unrepresented slow leak valve. A typical pressure is about 1.5 Torr. DMAH is introduced into the reaction chamber from the DMAH line, with a total pressure of about 1.5 Torr and a DMAH partial pressure of about $5.0 \times 10^{-3}$ Torr. Then the halogen lamps 330 are energized to directly heat the wafer, thereby causing selective Al deposition.

After a predetermined deposition time, the DMAH supply is interrupted. The deposition time is so selected that the Al film on Si (mono-crystalline silicon substrate 1) becomes equally thick as $SiO_2$ (thermal silicon oxide film 2), and can be experimentally determined in advance.

Figure 14B:
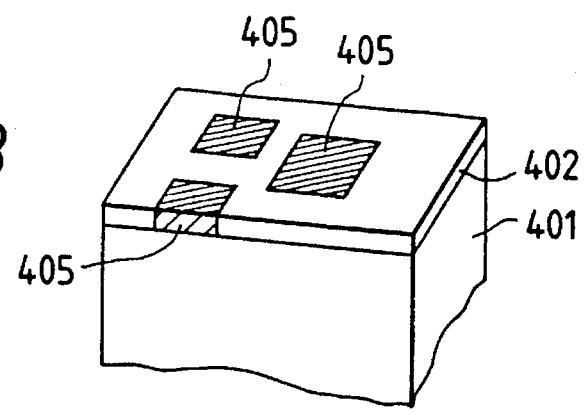

In this process, the substrate surface is heated to ca. 270° C. by direct heating, and the procedure explained above causes selective deposition of an Al film 405 in the aperture, as shown in FIG. 14B.

The foregoing is called a first film forming step for forming an electrode in an aperture.

After the first film forming step, the CVD reaction chamber 312 is evacuated, by the vacuum system 316b, to a pressure not exceeding $5 \times 10^{-3}$ Torr. Simultaneously the Rf etching chamber 313 is evacuated to a pressure not exceeding $5 \times 10^{-6}$ Torr. After confirmation of the evacuations of the chambers, the gate valve 310c is opened, then the substrate is moved from the CVD reaction chamber 312 to the Rf etching chamber 313 by the transport means, and the gate valve is closed. The Rf etching chamber 313 is evacuated to a pressure not exceeding $10^{-6}$ Torr, and is then maintained in argon atmosphere of $10^{-1}$–$10^{-3}$ Torr by argon supply from the supply line 322. The substrate holder 320 is maintained at ca. 200° C., and an Rf power of 100 W is supplied to the Rf etching electrode 321 for about 60 seconds 10 to generate an argon discharge in the chamber 313, whereby the substrate surface is etched with argon ions and the unnecessary surficial layer of the CVD deposition film can be eliminated. The etch depth in this case is about 100 Å, corresponding to the oxide film. The surface etching, of the CVD deposition film, conducted in the Rf etching chamber, may be dispensed with since the surfacial layer is free from oxygen, etc., as the substrate is transported in vacuum. In such case, the Rf etching chamber 313 may serve for varying the temperature within a short time if the temperature is significantly different between the CVD reaction chamber 312 and the sputtering chamber 314.

After the Rf etching, the argon supply is terminated, and the Rf etching chamber 313 is evacuated to $5 \times 10^{-6}$ Torr. Then the sputtering chamber is also evacuated to $5 \times 10^{-6}$ Torr or lower, and the gate valve 310d is opened. The substrate is transferred from the Rf etching chamber 313 to the sputtering chamber 314 by the transport means, and the gate valve 310d is closed.

Subsequently the sputtering chamber is maintained at argon atmosphere of $10^{-1}$–$10^{-3}$ Torr as in the Rf etching chamber 313, and the substrate holder 323 is maintained at 200°–250° C. Argon discharge is induced by a DC power of 5–10 kW to scrape the target of Al or Al-Si (Si: 0.5%) with argon ions, thereby depositing Al or Al-Si onto the substrate with a deposition speed of ca. 10000 Å/min. This is a non-selective deposition step, and is called a second film forming step for forming wirings connected to the electrodes.

After the formation of the metal film of about 5000 Å on the substrate, the argon supply and the DC power application are terminated. The load lock chamber 311 is evacuated to a pressure of $5 \times 10^{-3}$ Torr or lower, then the gate valve 310e is opened and the substrate is moved. After the gate valve 310e is closed, the load lock chamber 311 is supplied with nitrogen gas to the atmospheric pressure. Subsequently the gate valve 310f is opened and the substrate is taken out.

Figure 14C:
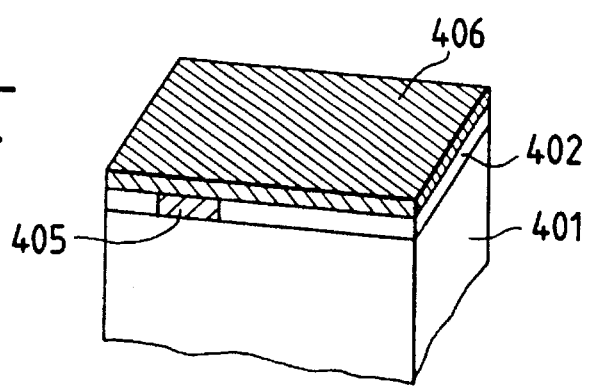

The second Al film deposition step explained above forms an Al film 406 on the $SiO_2$ film 402, as shown in FIG. 14C.

Figure 14D:
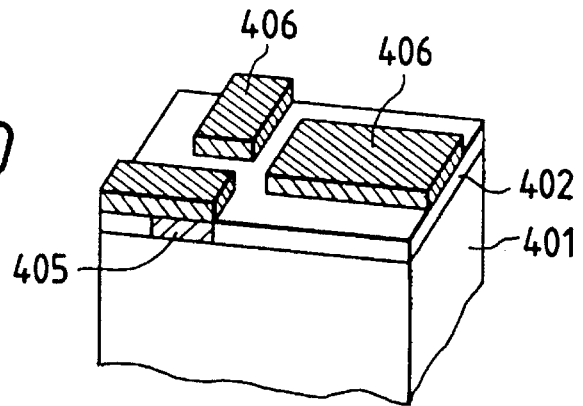

Subsequently the Al film 406 is patterned as shown in FIG. 14D to obtain the wirings of desired shape.

Experimental examples

The following are experimental results indicating the superiority of the above-explained Al-CVD method and the satisfactory quality of the Al film deposited by said method in the apertures.

There were prepared plural substrates, each consisting of an N-type monocrystalline silicon wafer, provided thereon with a thermally oxidized $SiO_2$ film of a thickness of 8000 Å, in which apertures of different sizes from 0.25×0.25 μm to 100×100 μm were formed by patterning to expose the underlying monocrystalline silicon (samples 1—1).

These samples were subjected to the Al film formation by the Al-CVD method, employing DMAH as the raw material gas and hydrogen as the reaction gas, with a total pressure of 1.5 Torr and a DMAH partial pressure of $5.0 \times 10^{-3}$ Torr, and with the substrate surface temperatures selected in a range of 200°–490° C. by direct heating under the regulation of electric power supplied to the halogen lamps. The obtained results are summarized in Table 1.

TABLE 1

| | Substrate surface temp. (°C.) | | | | | | | | | | | | | |
|---|---|---|---|---|---|---|---|---|---|---|---|---|---|---|
| | 200 | 230 | 250 | 260 | 270 | 280 | 300 | 350 | 400 | 440 | 450 | 460 | 470 | 480 | 490 |
| Deposition speed (Å/min.) | ←— 1000–1500 —* | | | | —————————— 3000–5000 ——————————————→ | | | | | | | | | |
| Throughput (wafer/hr) | ←—— 7–10 ——* | | | | ————————————— 15–30 ————————————→ | | | | | | | | | |
| Si linear defects | ←—— not observed ——————————————————————————→ | | | | | | | | | | | | | |
| Carbon content | ←—— not detected ——————————————————————————→ | | | | | | | | | | | | | |
| Resistivity (μΩcm) | ←— 2.7–3.3 —* | | | | ————————————— 2.8–3.4 ———————————→ | | | | | | | | | |
| Reflectance (%) | ←—— 8.5–9.5 ——* | | | | —————— 90–95 —————* | | | | | ———— ca. 60 ——→ | | | | |
| Hillock (>1 μm) density ($cm^2$) | ←— 1–$10^2$ —* | | | | —————— 0–10 —————* | | | | | ———— $10$–$10^4$ —→ | | | | |
| Spike formation (%) destruction frequency of 0.15 μm junction) | ←—— 0 ————————————————————* | | | | | | | | | | ———— 0–30 ——→ | | | |

As will be apparent from Table 1, aluminum was deposited in the apertures with a deposition speed as high as 3000–5000 Å/min. at the substrate surface temperature of 260° C. or higher obtained by direct heating.

The Al film in the apertures, obtained in a substrate surface temperature range of 260°–440° C., showed satisfactory characteristics, with no carbon content, a resistivity of 2.8–3.4 μΩcm, a reflectance of 90–95%, a hillock ($\geq 1$ μm) density of 0–10 $cm^{-2}$, and an almost zero spike formation (frequency of destruction of 0.15 μm junction).

On the other hand, though the film quality obtained in a surface temperature range of 200°–250° C. was somewhat inferior to that obtained in the temperature range of 260°–440° C., it is considerably better than that obtainable with the conventional technology, but the deposition speed could not exceed 1000–1500 Å/min. and the throughput was in a relatively low range of 7–10 wafer/hr.

At the substrate surface temperature equal to or higher than 450° C., the quality of the Al film in the apertures were deteriorated, with a reflectance of 60% or lower, a hillock ($\geqq 1$ μm) density of $10-10^4$ cm$^{-2}$ and an alloy spike formation of 0–30%.

In the following there will be explained how the above-explained method can be advantageously applied to the apertures such as contact holes or through-holes.

The method can be advantageously applied to the contact holes or through-holes composed of the materials explained in the following.

The Al film formation was conducted on the following substrates (samples) under the same conditions as in the Al film formation on the above-mentioned samples 1-1.

Samples 1-2 were prepared by forming, on monocrystalline silicon constituting a first substrate surface material, a silicon oxide film constituting a second substrate surface material by means of CVD method, and forming apertures by a photolithographic process to locally expose the surface of monocrystalline silicon. The SiO$_2$ film was 8000 Å thick, and the apertures were sized from 0.25×0.25 μm to 100×100 μm. (Such sample will hereinafter be represented as "CVD SiO$_2$ (or simply SiO$_2$)/monocrystalline silicon".)

There were also prepared:

a sample 1-3 of boron-doped oxide film formed by normal pressure CVD (hereinafter written as BSG)/monocrystalline silicon;

a sample 1-4 of phosphor-doped oxide film formed by normal pressure CVD (PSG)/monocrystalline silicon;

a sample 1-5 of boron- and phosphorus-doped oxide film formed by normal pressure CVD (BSPG)/monocrystalline silicon;

a sample 1-6 of nitride film formed by plasma CVD (P-SiN)/monocrystalline silicon;

a sample 1-7 of thermal nitride film (T-Sin)/monocrystalline silicon;

a sample 1-8 of nitride film formed by low pressure CVD (LP-SiN)/monocrystalline silicon; and a sample 1-9 of nitride film formed by ECD (ECR-SiN)/monocrystalline silicon.

Further, samples 1-11 to 1-179 were prepared by taking all the combinations of the first surface materials of 18 kinds and the second surface materials of 9 kinds shown in the following. (It is to be noted that the sample numbers 1-10, 20, 30, 40, 50, 60, 70, 80, 90, 100, 110, 120, 130, 140, 150, 160 and 170 are lacking.) The first surface materials employed were monocrystalline silicon (mono-Si), polycrystalline silicon (poly-Si), amorphous silicon (a-Si), tungsten (W), molybdenum (Mo), tantalum (Ta), tungsten silicide (WSi), titanium silicide (TiSi), aluminum (Al), aluminum silicon (Ai-Si), titanium aluminum (Al-Ti), titanium nitride (Ti-N), copper (Cu), aluminum silicon copper (Ai-Si-Cu), aluminum palladium (Al-Pd), titanium (Ti), molybdenum silicide (Mo-Si), and tantalum silicide (Ta-Si). The second substrate surface materials employed were T-SiO$_2$, SiO$_2$, BSG, PSG, BPSG, P-SiN, T-SiN, LP-SiN and ECR-SiN. In all these samples, there could be obtained satisfactory Al films comparable to those in the aforementioned samples 1-1.

Subsequently, the Al was non-selectively deposited by sputtering on the substrates subjected to the selective Al deposition as explained above, and was then patterned.

The Al film obtained by sputtering and the selectively deposited Al film in the apertures showed electrically and mechanically satisfactory contact, because of the improved surface state of the Al film in the apertures.

Now reference is made to FIGS. 9A and 9B for explaining a method for producing a first embodiment of the wiring structure. On a silicon substrate 15 in which functional elements were prepared in advance, a BPSG or PSG film was deposited with a thickness of 10000–16000 Å for example by CVD, contact holes were patterned for connecting the contact areas of the semiconductor substrate 15 with the first wirings 11. Then, in the first insulation layer 13, grooves in the pattern of the first wirings 11 were formed by etching, utilizing a mixture of C$_3$F$_8$ and CHF$_3$ with a pressure of ca. 0.1–0.8 Pa, for an etch depth of 5000–8000 Å.

In this operation, the semiconductor substrate 15 exposed in the contact holes was also etched by a depth of about 300–500 Å. However, a more preferable method is to interrupt the etching of the first insulation layer 13 at the formation of said contact holes. In this method, the remaining portions at the contacts of the semiconductor substrate 15 can be etched off at the formation of the groove pattern for the first wirings 11 by etching, so that the unnecessary etching of the semiconductor substrate 15 can be avoided. The thickness to be left unetched can be suitably selected according to the experimental results.

After the above-mentioned etching of the wiring pattern, and before the removal of the photoresist, plasma was generated by introducing SF$_6$ gas and applying an Rf power of 100 W, thereby giving electrons, generated by said plasma, only to the areas where the wirings are to be formed, in order to obtain better selectivity. Subsequently the photoresist was removed by a wet process. The gas to be introduced is not limited to SF$_6$. Then the Al-CVD method was conducted to deposit aluminum in the contact holes thus opened and in the wiring pattern.

The film formation was conducted with a substrate surface temperature of 300° C., employing DMAH and hydrogen.

The aluminum deposition was terminated when the surface of the first wirings 11 approximately reached the height of the first insulation layer 13. A substantially flat surface was obtained over the entire area of the wafer, since the deposition speed was higher in the contact holes than in the grooves, based on the difference in the electron donating ability.

Subsequently a PSG film or a silicon nitride film obtained by plasma CVD was deposited with a thickness of 1000–16000 Å over the entire surface of the wafer. Then through-holes for connecting the second wirings 12 and the first wirings 11 were opened, and the second insulation layer 14 was etched to form grooves according to the pattern of the second wirings 12.

The etching method for the through-holes and the wiring pattern is similar to that for the contact holes and the first wiring pattern 11. More specifically, the insulation layer was left with a thickness of 5000–8000 Å under an area where the second wiring 12 is to be buried but the through-hole is not opened. Also after the formation of the grooves in the wiring pattern, plasma was generated for several seconds to provide electrons to the areas where aluminum is to be deposited, in order to improve the selectivity, as explained before. Thus a semiconductor device with the cross-sectional structure shown in FIG. 9A could be obtained.

The present embodiment provides following advantages:

(1) Since the present embodiment does not include the aluminum etching for wiring pattern formation, the undesirable aluminum etching in the contact areas, as in case of alignment error between the aluminum pattern and the contact hole in the conventional semiconductor device, cannot occur. Thus the contact hole can be securely filled with aluminum, which can be securely connected with the first wiring 11. The same applies to the relation between the through-hole 16 and the second wiring 12. Consequently the wiring structure can be obtained with a high reliability and a high production yield. Also a high level of integration is enabled since the width of wiring need not be enlarged in the vicinity of the contact hole or the through-hole; and (2) The present embodiment allows formation of the wiring at substantially the same physical height as that of the insulation layer therearound, and can therefore avoid the disconnection or uneven thickness of aluminum and the uneven width of wiring, resulting from the significant surface irregularity in the aforementioned first conventional example. This fact also contributes to the improvements in production yield, level of integration and reliability. Also the freedom in design is increased because there are fewer limitations on the position of the contact hole or through-hole, and on the determination of wiring patterns. This fact undoubtedly contributes to improvement in the performance of the entire circuit and reduction of the period required for circuit development.

Figure 15A:
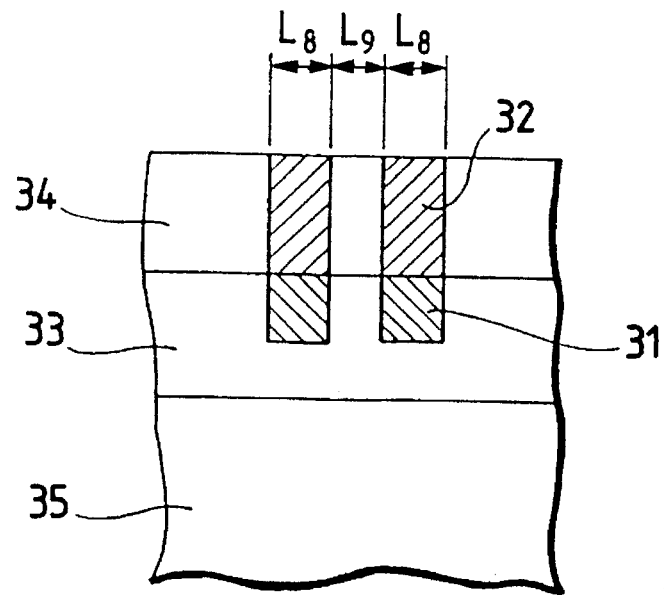
FIGS. 15A and 15B are schematic views of a second embodiment of the present invention.
Figure 15B:
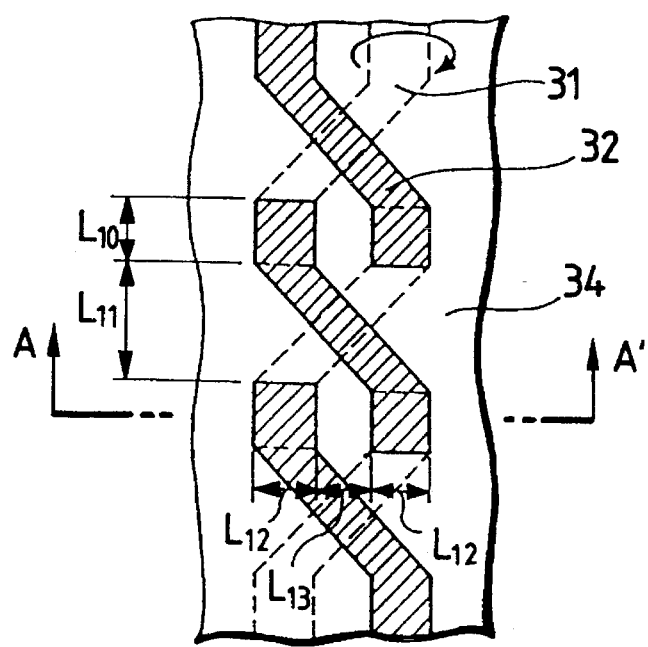

FIGS. 15A and 15B illustrate a second embodiment of the present invention, providing twisted pair lines formed with the Al-CVD method for constituting an inductance. FIG. 15B is a schematic plan view of said embodiment, and FIG. 15A is a schematic cross-sectional view along a line A—A' in FIG. 15B.

A first wiring 31 formed in a groove in a first insulation layer 33 of silicon oxide and a second wiring 32 formed in a second insulation layer 34 of silicon oxide are positioned mutually close, and mutually cross by through-holes formed in the second insulation layer 34. Such crossings of wirings were formed at extremely short intervals to form so-called twisted pair lines constituting an inductance. In FIG. 15A, distances L8 and L9 are respectively 0.8 and 0.6 μm, and dimensions L10, L11, L12 and L13 in FIG. 15B are respectively 0.8, 1.9, 0.8 and 0.6 μm. In comparison with the conventional twisted pair lines shown in FIG. 2B, the present embodiment can form such pair lines within an extremely narrow area.

Figure 2A:
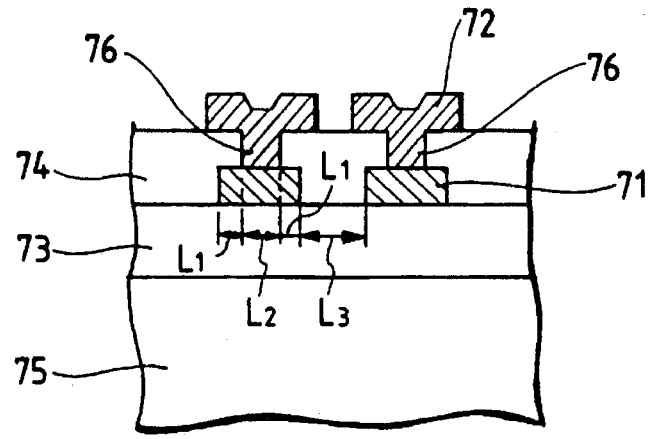
Figure 2B:
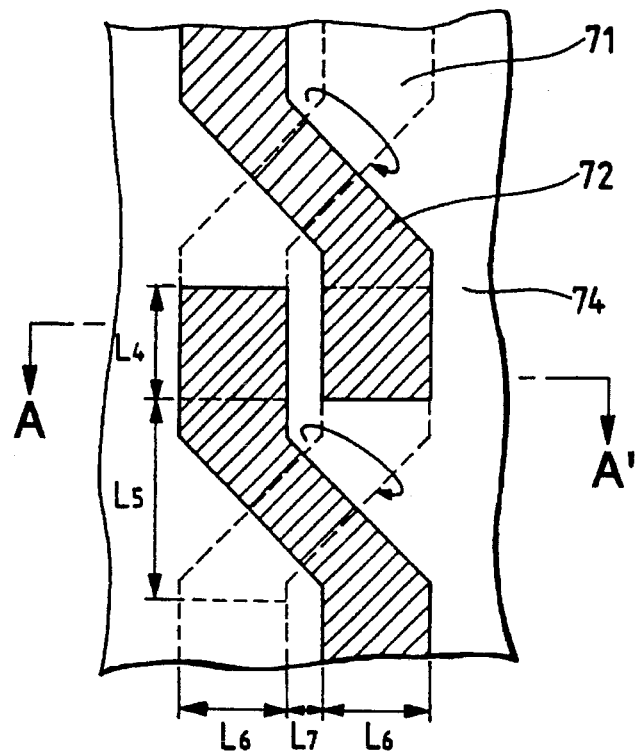
Figure 3:
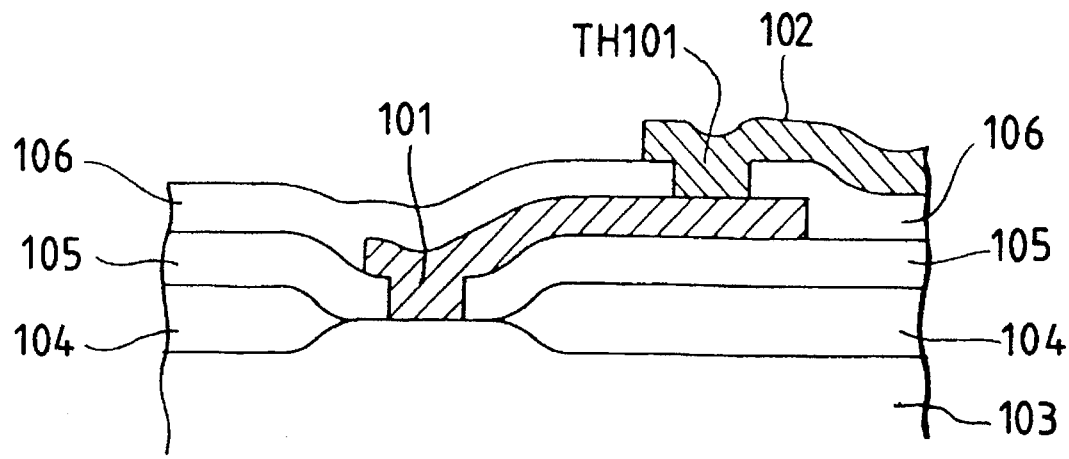
FIGS. 3 to 6 are schematic cross-sectional views of conventional two-layered aluminum wiring structures.

In the second conventional example shown in FIGS. 2A and 2B, it is difficult to position the paired lines at a short mutual distance, in comparison with the present embodiment, because the wiring structure is limited by the disconnection or migration resulting from the surface steps and by the shape of the contact holes and through-holes required for connections across the insulation layers.

The present embodiment allows formation of twisted pair lines with an extremely short separation, thereby reducing the influence of noise voltages resulting from electromagnetic induction and inductive coupling. Such effect is generally desired for the twisted pair lines.

The following is an explanation of the producing method of the semiconductor device of the second embodiment, with reference to FIGS. 15A and 15B. The method is same as that for the first embodiment, except for the absence of contact with the semiconductor substrate. Therefore, the procedure will be explained until the formation of the first wiring 31. On a semiconductor substrate 35 already having functional elements therein, a BPSG or PSG layer 33 was deposited with a thickness of 10000–16000 Å for example by CVD, and a pattern for burying the first wiring 31 was formed by photolithography and etching, with an etch depth of 5000–8000 Å in the first insulation layer 33.

Prior to the removal of the photoresist used in the etching, $SF_6$ was introduced and an RF power of 100 W was applied to generate plasma, thereby creating an electron donating surface in the etched areas. After the removal of photoresist, aluminum was selectively deposited by the Al-CVD method utilizing DMAH gas, until the aluminum surface became substantially as high as the surface of the first insulation layer 33.

The subsequent steps will not be explained as they are identical with those in the first embodiment.

All the advantages obtained in the first embodiment can also be obtained in this second embodiment. In addition the present embodiment enables the preparation of highly integrated twisted pair lines, because the wiring areas need not be enlarged in the vicinity of the contact or through hole, thereby enhancing the effect of reducing noise, arising from external perturbation such as inductive coupling or electromagnetic induction.

Figure 16A:
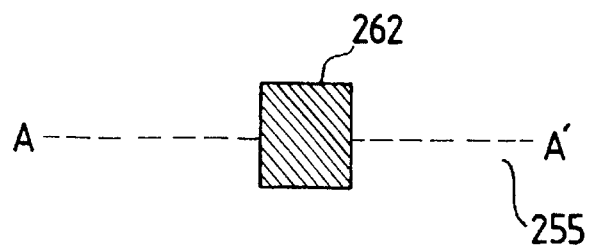
FIGS. 16A and 16B are views showing the basic concept of the present invention.
Figure 16B:
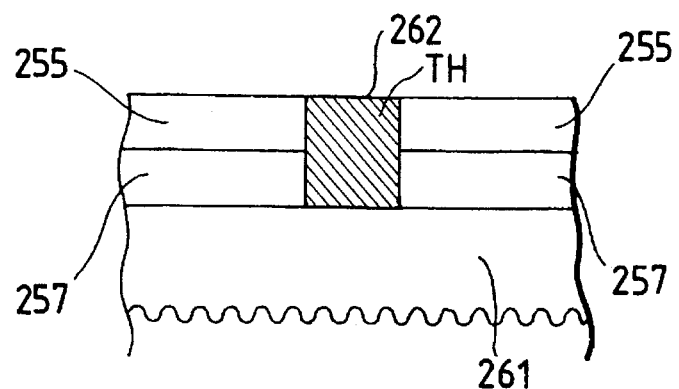

FIG. 16A is a schematic plan view of a multi-layered wiring structure adapted for use in a semiconductor device and constituting a preferred embodiment of the present invention, and FIG. 16B is a schematic cross-sectional view along a line A—A' in FIG. 16A.

On a semiconductor substrate 261 for example of silicon, there are formed plural insulation films such as a first insulation film 257 of $SiO_2$ and a second insulation film 255 of $SiO_2$, and there is also formed a through-hole TH of a size determined according to the thickness of the insulation films. In said through-hole TH, $SiO_2$ is removed down to the surface of the crystalline substrate 261. Then the Al-CVD method is executed to grow monocrystalline aluminum 262 on the substrate at the bottom, thereby completely filling the interior of the hole TH and forming a metal film constituting a connecting member, for connecting the substrate surface and a second wiring layer (not shown) to be formed above.

Also in the area with plural laminated insulation layers as explained above, it is possible to fill a fine and deep hole with an aspect ratio not only of 1.0 but also of 1.5–2.0 or even larger, which is difficult to fill in the prior art, by forming a hole penetrating the insulation layers and applying the aforementioned Al-CVD method. Thus the production yield can be significantly improved for a device of which the desired performance is achievable with an aspect ratio of 1.5 or larger. Also the obtained connection is free from lateral projection as in the prior art shown in FIG. 5, since, in a three-layered wiring structure, the penetrating hole can be filled by a single deposition process.

Thus the connection of the present embodiment reduces the parasitic capacitance resulting from the connecting member for connecting the upper and lower wiring layers, and does not generate surface steps around the connecting area. Furthermore the diameter of hole can be unified to a necessary minimum one, and the formation of the connecting member can be achieved with a deposition and patterning process, with reduced concern for alignment error, in contrast to the prior process requiring two processes of deposition and patterning. Also in a multi-layered wiring structure with three or more wiring layers, obtained by repeating the above-explained procedure, the surface step does not increase cumulatively because the film surface developed in the aperture is substantially flat. The substrate surface mentioned above thus includes an aluminum film or a metal film principally composed of aluminum, constituting a wiring layer.

Figure 17A:
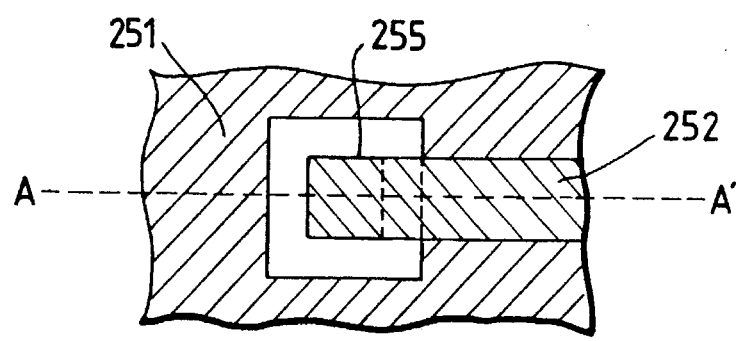
FIGS. 17A and 17B are schematic views of a third embodiment of the present invention.
Figure 17B:
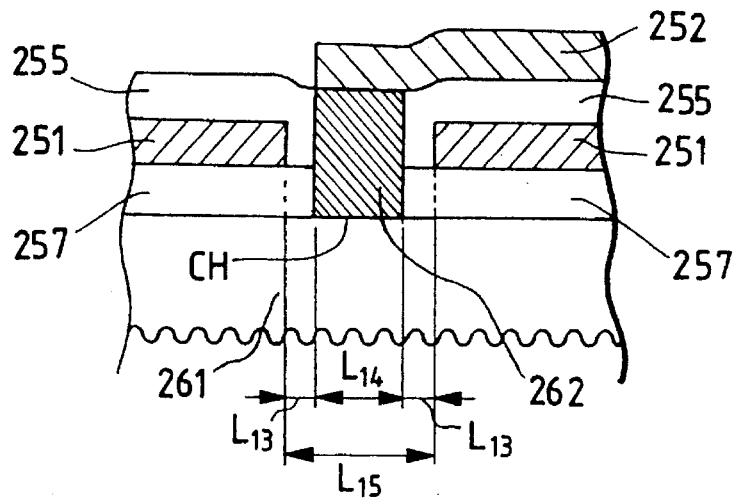

FIG. 17A is a schematic plan view of a semiconductor device constituting another embodiment of the present invention, and FIG. 17B is a cross-sectional view along a line A—A' in FIG. 17A. The producing method for the device will be outlined in the following. At first an aperture was formed in a first insulation film, a first wiring layer thereon and a second insulation film thereon, all formed on a substrate surface, in the same manner as shown in FIGS. 16A and 16B, then the aperture TH was completely filled by the growth of monocrystalline aluminum 262, and an aluminum wiring, similar to the second aluminum wiring shown in FIGS. 3–6, was formed on the second insulation film 255.

This method eliminates the necessity of forming, on the $SiO_2$ film exposed in the aperture, the first Al layer 101 which is inevitable in the prior art as a base for making contact with the second Al layer 102, as shown in FIGS. 3 to 6. Also even in case the entire peripheral area of the $SiO_2$ 255 is covered by the first Al layer 101 10 as shown in FIG. 17A, an electrode can be formed to the conductor 261 at the bottom as long as a space for the aperture only is available.

Figure 4:
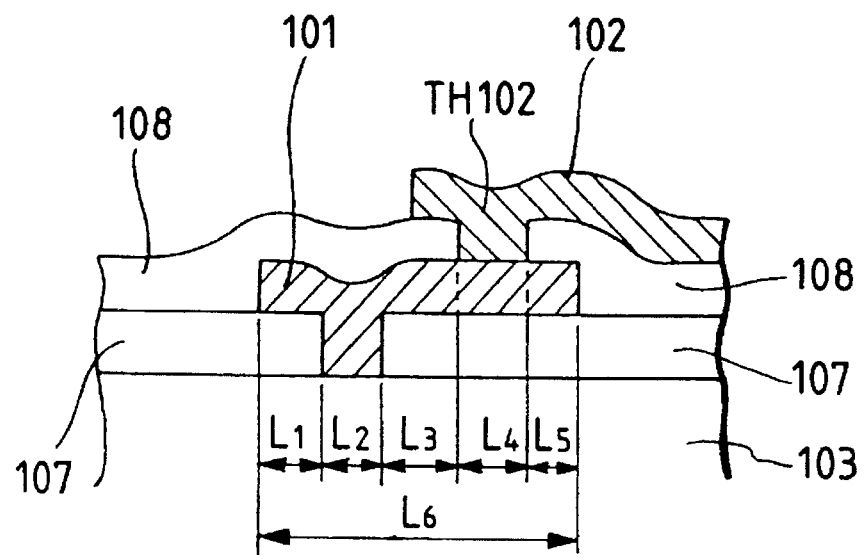
Figure 6:
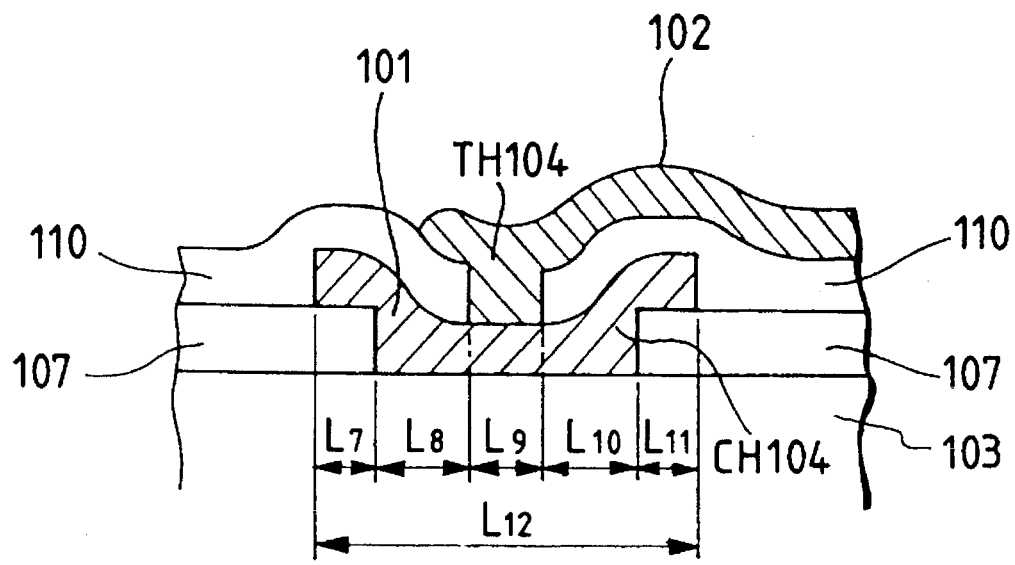

The dimensions L13, L14 and L15 in FIG. 17B are respectively 0.6, 0.8 and 2.0 μm, whereas the dimensions L6 in FIG. 4 and L12 in FIG. 6 are respectively 4.2 and 3.2 μm. Thus the present embodiment can reduce the area required for wirings, in comparison with the prior art.

Figure 18A:
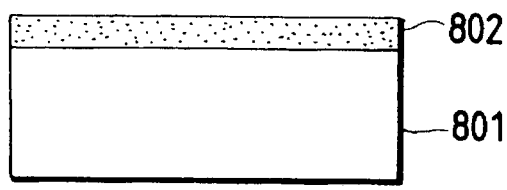
FIGS. 18A to 18F are views showing the steps for producing the semiconductor device shown in FIGS. 17A and 17B.
Figure 18D:
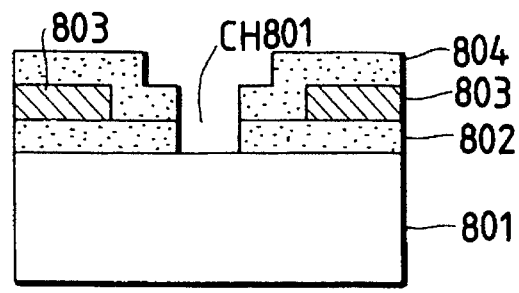
Figure 18B:
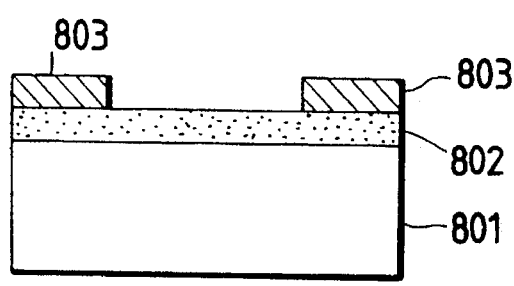

The present embodiment will be explained further in the following, with reference to FIGS. 17A, 17B and 18A to 18F, in which FIGS. 18A and 18B illustrate steps of an example of the producing method for said semiconductor device.

After the formation of a diffusion layer on a crystalline silicon substrate 801, a first insulation layer 802 of silicon oxide was deposited with a thickness of 8000 Å (FIG. 18A). In the present embodiment, the first insulation layer 802 was composed of silicon oxide containing phosphorus and boron, deposited by a normal pressure CVD process. It may however be replaced by silicon oxide containing phosphorus or silicon oxide without impurity.

Then, on the first insulation layer 802, an aluminum layer 803 was deposited with a thickness of 8000 Å and formed into a predetermined pattern by an ordinary photolithographic process (FIG. 18B). More specifically, aluminum-silicon was deposited by sputtering, and the patterning was conducted by dry etching with $Cl_2$—$BCl_3$—He.

Figure 18E:
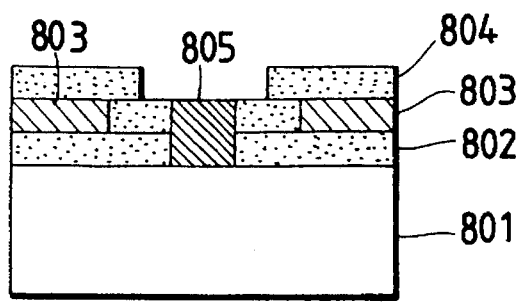
Figure 18C:
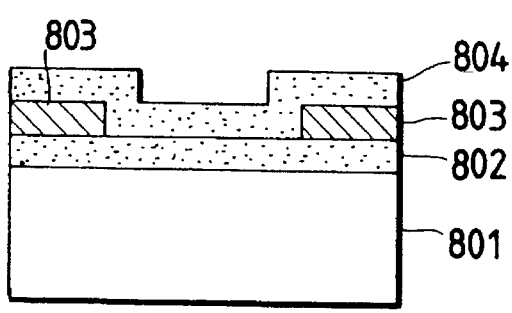

Then a second insulation layer 804 of silicon oxide, doped with phosphorus, was deposited with a thickness of 6000 Å by normal pressure CVD (FIG. 18C).

Subsequently a contact hole CH1 of an aspect ratio of 1.0 or larger was opened through the second insulation layer 804 and the first insulation layer 802 (FIG. 18D). In the present embodiment, a photoresist pattern was prepared by a reduction projection exposure apparatus, and dry etching was conducted with $CHF_3$—$C_2F_6$.

Then the aforementioned Al-CVD method was employed to deposit monocrystalline aluminum in the contact hole CH1 (FIG. 18E). In the present embodiment, aluminum-silicon was deposited instead of pure aluminum. There was employed the film forming apparatus shown in FIG. 10, and the film forming conditions were same as explained before, with a film deposition time of ca. 28 minutes. Hereinafter the sample worked up to the state shown in FIG. 18D will be called the substrate.

Figure 18F:
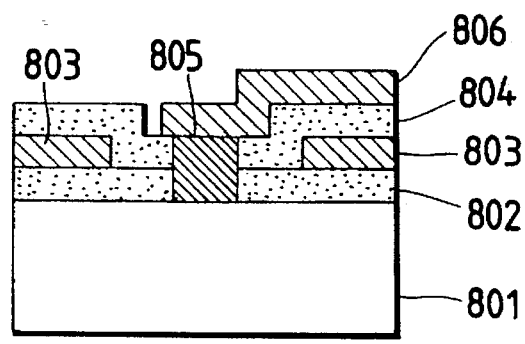

Then, on the second insulation layer 804 and the Al-Si film 805, a second aluminum layer 806 was non-selectively deposited by sputtering, and was formed into a desired pattern by an ordinary photolithographic process (FIG. 18F).

In the present embodiment, the patterning was conducted by dry etching with $Cl_2$—$BCl_3$—He, as in the case of the first aluminum layer 803.

A semiconductor device as shown in FIG. 18F could be obtained through the process explained above.

The foregoing description has been limited to a semiconductor device employing a monocrystalline silicon substrate, but a film of satisfactory quality can be obtained also in a device utilizing a substrate of other electron donating materials, such as GaP.

Figure 19A:
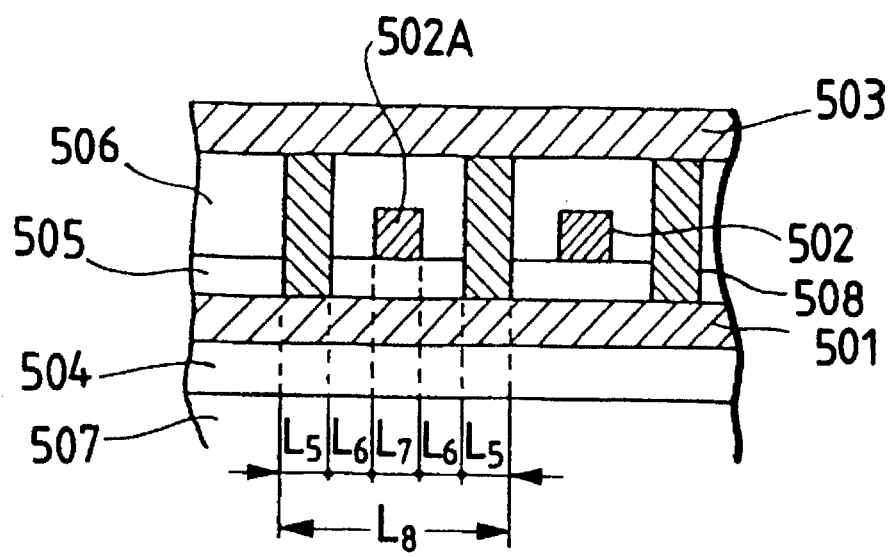
FIGS. 19A and 19B are schematic views of a fourth embodiment of the present invention.
Figure 19B:
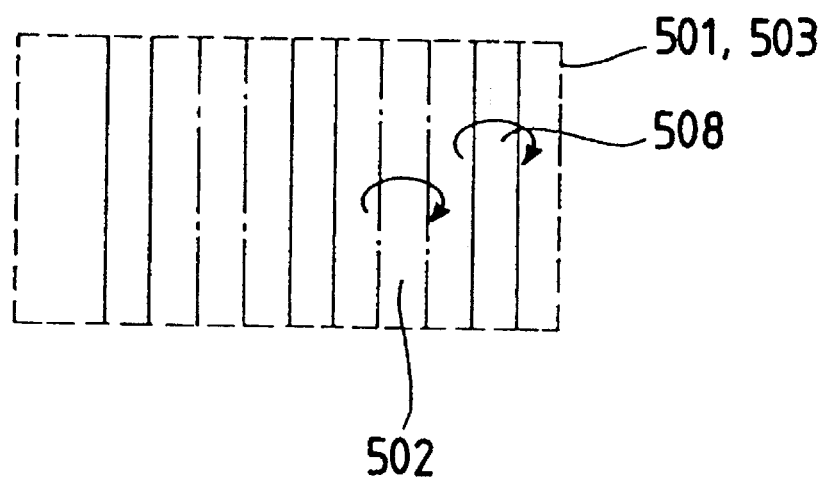

FIGS. 19A and 19B are respectively a cross-sectional view and a plan view of a coaxial wiring structure of the present invention. On a semiconductor substrate 507 of silicon, there are laminated, in succession, an insulation layer 504 and a first aluminum layer 501 constituting a shield conductive layer. A second aluminum layer 502, used as a signal line, is surrounded by a third aluminum layer 503, the first aluminum layer 501 and aluminum members 508 deposited selectively in apertures of a high aspect ratio penetrating concentrically insulation layers 505, 506, all these components serving as a shield line. The crosstalk between the signal lines, for example the second aluminum lines 502 and 502A, can be suppressed by the above-explained structure in which each signal line is surrounded by other aluminum components which are connected to a fixed potential such as ground potential. Insulation layers 505, 506 may be composed of an inorganic material such as silicon oxide or silicon nitride, or an organic material, but in particular the insulation layer 506 is preferably composed of silicon oxide formed from tetraethylorthosilicate (TEOS-$SiO_2$).

Figure 7A:
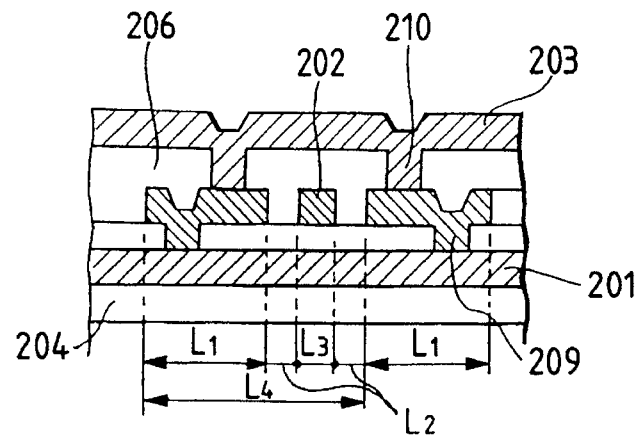
FIGS. 7A, 7B and 8 are schematic views of conventional semiconductor devices.
Figure 7B:
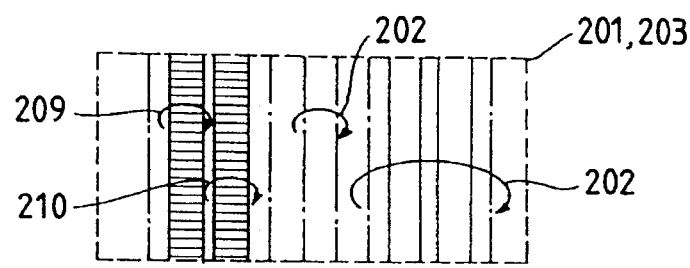
Figure 8:
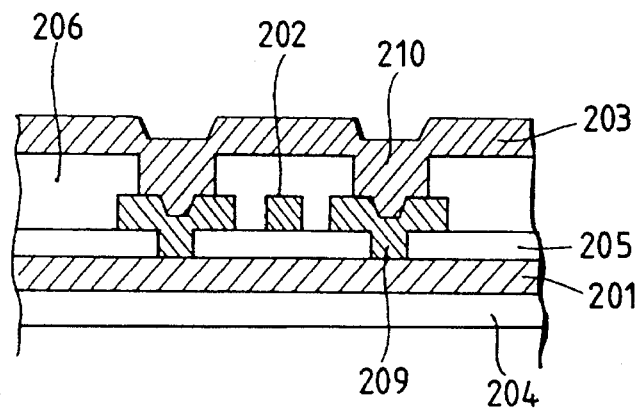

The conductive member 508, capable of connecting the upper and lower wirings through plural insulation layers, can reduce the occupied area and the parasite capacitance. In addition, because of its substantially flat lateral face, it does not require additional wiring space as shown in FIGS. 7A and 8 in the plural insulation layers and reduces the surface step.

The occupied area can be particularly reduced, even for a large depth, by selecting an aspect ratio at least equal to 1.0, preferably 1.5 and most preferably 2.0.

FIGS. 20A to 20H illustrate an example of the producing method of a semiconductor device involving the coaxial wiring structure of the present invention.

Figure 20A:
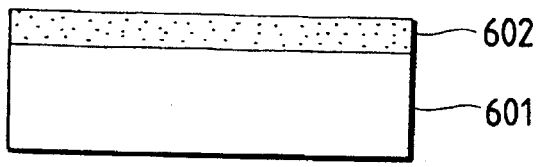
Figure 20A:
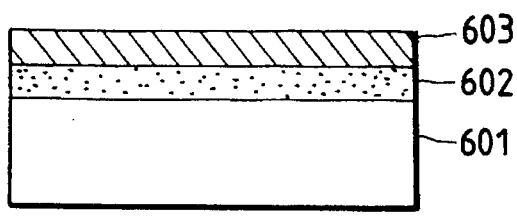
Figure 20A:
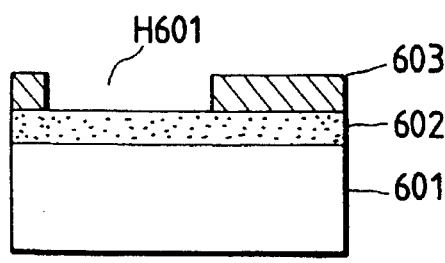
Figure 20A:
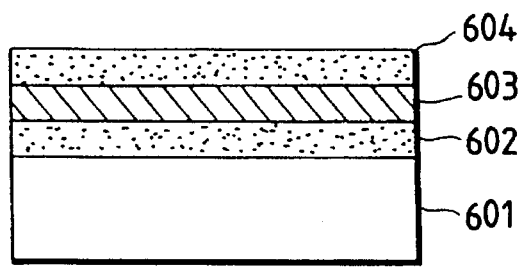
Figure 20A:
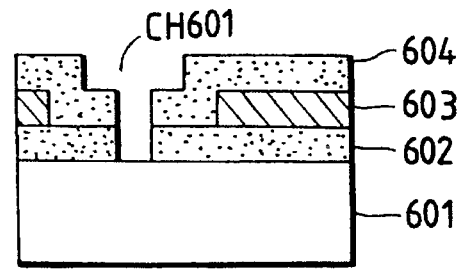
Figure 20A:
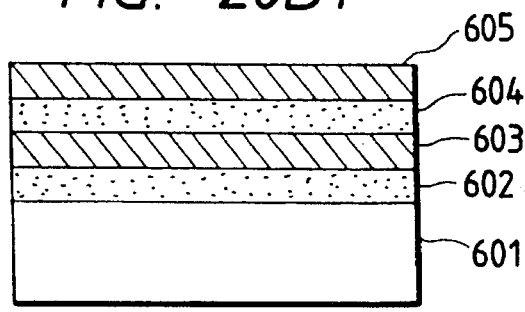
Figure 20A:
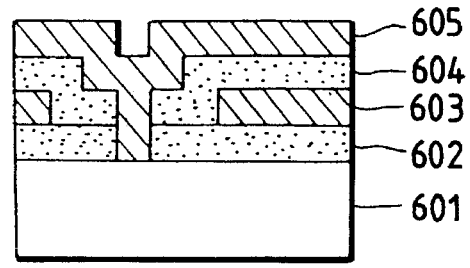
Figure 20E:
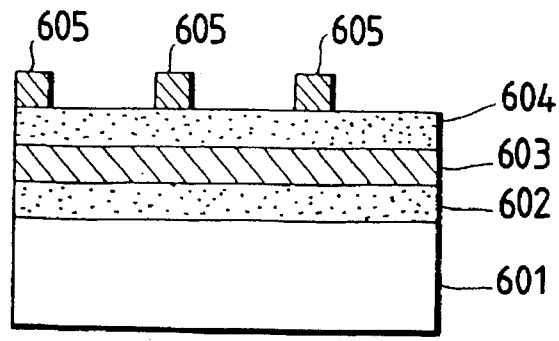

On a silicon substrate 601 in which diffusion layers, etc., were already formed by an ordinary process for semiconductor device preparation, an interlayer insulation film 602 was deposited by a thickness of 5000 Å (FIG. 20A).

The interlayer insulation film was composed, in the present embodiment, of silicon oxide doped with boron and phosphorus, but it may also be replaced by silicon oxide doped with phosphorus or by undoped silicon oxide.

Figure 1A:
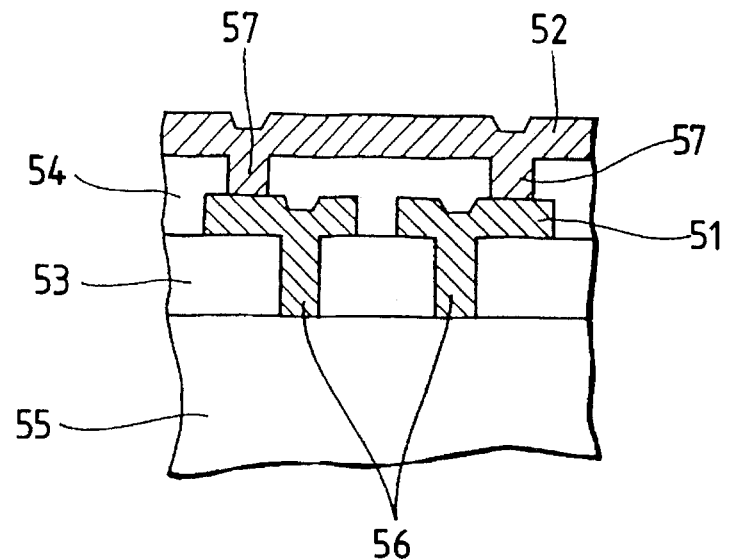
FIGS. 1A, 1B, 2A and 2B are schematic views of conventional semiconductor devices.
Figure 1B:
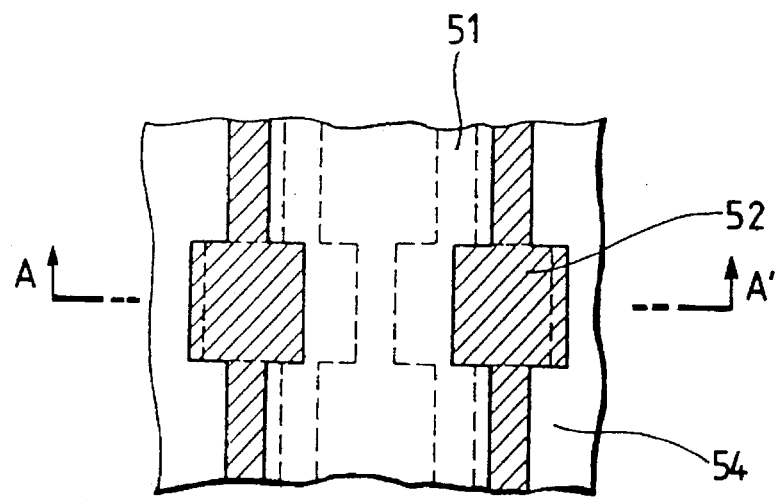

Then, on the insulation layer 602, there was deposited a first aluminum layer 603 for constituting the bottom shield line, with a thickness of 3000 Å (FIG. 20B1).

In the present embodiment, the aluminum deposition was conducted by sputtering, but it may also be conducted by electron beam evaporation or by CVD. Then, in the thus deposited aluminum layer 603, there was opened a hole H1 larger than the contact hole, in a position where contact is made between the signal line and the element on the substrate (FIG. 20B2). FIGS. 20B2, 20C2 and 20D2 illustrate the aluminum patterning steps in a contact area, achieved by ordinary photolithography employing photoresist and chlorine-based dry etching.

Then an interlayer insulation film 604, for separating the aluminum layer 603 constituting the bottom shield line and the signal line, was deposited with a thickness of 6000 Å (FIG. 20C1).

The insulation film 604 was composed of phosphorus-doped silicon oxide in the present embodiment, but it may be replaced by undoped silicon oxide. After the deposition, a contact hole CH601 was opened in a position where contact is to be made between the signal line and the element on the substrate (FIG. 20C2), by means of ordinary photolithography employing photoresist and dry etching.

The structure up to the states shown in FIGS. 20C1 and 20C2 can be obtained by a known technology for semiconductor device manufacture.

Subsequently an aluminum-silicon layer 605 was deposited as the signal line. The deposition may be achieved by sputtering or electron beam evaporation if the contact hole has a certain large size, but, in the present embodiment, selective Al-CVD method and sputtering were employed since the contact hole was as small as 1 μm×1 μm. The deposition of aluminum-silicon was conducted with the apparatus shown in FIG. 10 and with the depositing conditions explained before.

The deposition of aluminum-silicon, up to a thickness of 11000 Å which is equal to the sum of thicknesses of the insulation layers 602, 604, required about 22 minutes. In this operation the substrate surface temperature was maintained at 270° C. by direct heating. In this deposition step, the aluminum-silicon was deposited solely in the contact hole 601, as shown in FIGS. 20D1 and 20D2.

Then the deposited aluminum-silicon film 605 was formed into a predetermined wiring pattern (FIG. 20E), by ordinary photolithography employing photoresist and chlorine-based dry etching.

Figure 20F:
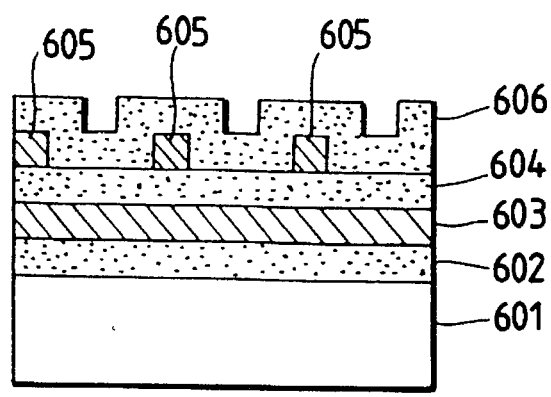
Figure 20G:
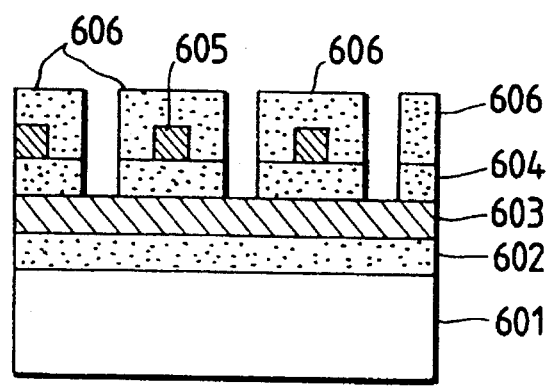

Subsequently an interlayer insulation film 606, for insulating the signal line 605 from the upper shield line, was deposited with a thickness of 6000 Å (FIG. 20F).

Said insulation film 606 in the present embodiment was composed of phosphorus-doped silicon oxide formed by CVD utilizing $O_3$-TEOS (tetraethyl orthosilicate), and the phosphorus doping was achieved by introducing TMP (tetramethyl phosphor). The substrate temperature was maintained at 400° C., and the phosphorus content in the insulation film 606 was about 6%. However ordinary CVD based on $SH_4O_2$-$PH_3$ may also be used for forming the insulation film 606.

Then narrow grooves were opened in areas where the lateral faces of the signal line 605 are to be shielded (FIG. 20G), by ordinary photolithography and dry etching. In the present embodiment, the grooves were formed by forming a photoresist pattern of a width of 0.8 μm by a reduction projection exposure apparatus, and conducting dry etching employing $C_2F_2$—$CHF_3$.

Figure 20H:
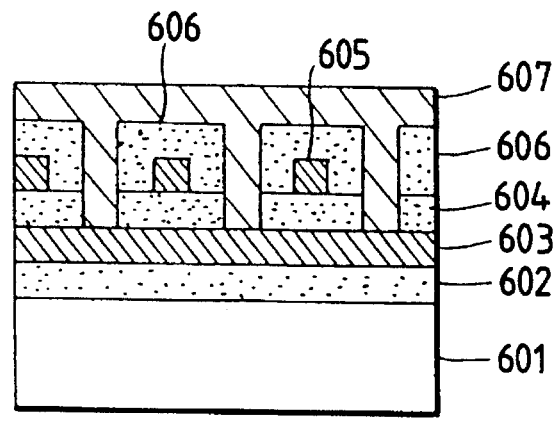

Finally an aluminum layer 607 was deposited on the upper and lateral faces of the signal line 605, thereby completing the shield (FIG. 20H).

Since the aluminum deposition was of an aspect ratio over 1.0, with a width of 0.8 μm and a depth of 1.2 μm, it could not be achieved for example by sputtering or electron beam evaporation. Consequently the groove filling relied on the selective Al-CVD method. In the present embodiment the lateral and upper faces 607 of the shield line were formed by the Al-CVD method and sputtering, as in the aluminum deposition for the signal line 605.

The difference in the formations of the signal line 605 and the shield line 607 lies in a fact that the shield line 607 was composed of pure aluminum without the addition of trimethyl phosphorus during the Al-CVD process and the deposited depth was 12000 Å.

After the aluminum deposition, the unnecessary parts of the shield line were removed by ordinary photolithography employing photoresist and chlorine-based dry etching.

Effect of the Invention

The present invention, based on wiring formation by the Al-CVD technology, enables a manufacturer to obtain flattened surfaces and a higher density in the wirings, thereby reducing the surface area of the semiconductor device and also reducing the production cost thereof. Also in the formation of twisted pair lines, it can enhance the effect of such pair lines.

The present invention can also reduce the area required for a multi-layered wiring structure and can provide a flatter surface on the semiconductor device, by forming a penetrating hole through plural laminated conductive and/or insulating layers and completely filling the hole by growing monocrystalline aluminum therein for example by the Al-CVD method, whereby one can obtain a semiconductor device extremely suitable for achieving a high level of integration.

Furthermore the present invention allows for an increase in the density of signal lines in a coaxial wiring structure, thereby achieving a higher level of integration in forming such coaxial wirings on a chip.

What is claimed is:

1. A method of producing a semiconductor device comprising:

a first step for forming a first insulating layer on a substrate;

a second step for forming a first wiring layer on the first insulating layer so that there is a section of the first insulating layer on which the first wiring layer is not formed;

a third step for forming a second insulating layer on the first wiring layer;

a fourth step for forming an aperture having an aspect ratio of not less than 1, and penetrating through the first and second insulating layers at the section on, or under which, the first wiring layer is not formed;

a fifth step for filling the aperture with a metal; and a sixth step for forming a second wiring layer in contact with the metal on the second insulating layer, wherein the above steps are performed in this order, and in the fifth step, a CVD process using alkylaluminum hydride and hydrogen is performed for depositing the metal, which comprises aluminum.

2. The method according to claim 1, wherein the alkylaluminumhydride is dimethylaluminumhydride.

3. The method according to claim 2, wherein in the fifth step, the substrate is maintained at a temperature higher than a decomposition temperature of the dimethylaluminumhydride, and lower than 450° C.

4. A method for producing a semiconductor device having a multi-layered wiring structure including a first insulation film provided on the surface of a substrate, a first patterned wiring layer provided on the first insulation film, a second insulation film provided to cover the first wiring layer, and a second wiring layer, said method comprising the steps of:

forming an aperture penetrating the first and second insulation films at a point at which the first wiring layer is absent, thereby exposing the surface of the substrate;

selectively depositing a metal comprising aluminum in the aperture by a CVD method utilizing alkylaluminum hydride gas and hydrogen, with the substrate maintained at a temperature higher than the decomposition temperature of the alkylaluminum hydride gas and lower than 450° C., to form selectively a connection member for connecting the surface of the substrate and the second wiring layer;

depositing non-selectively a metal film on the connection member and the second insulating film; and patterning the metal film to form the second wiring layer.

5. A method according to claim 4, wherein said selective deposition of the metal comprising aluminum is performed within a first chamber, and then the substrate is moved into a second chamber without exposing the substrate to the atmosphere, and said non-selective deposition of the metal film is performed within the second chamber.

6. A method according to claim 4, wherein the aperture has an aspect ratio greater than or equal to 1.5.

7. A method according to claim 4, wherein the selectively deposited metal comprising aluminum is selected from the group consisting of Al, Al-Si, Al-Ti, Al-Cu, Al-Si-Ti, and Ai-Si-Cu.

8. A method according to claim 4, wherein the non-selectively deposited metal film is selected from the group consisting of Al, Al-Si, Al-Ti, Al-Cu, Al-Si-Ti, and Al-Si-Cu.

9. A method for producing a semiconductor device comprising the steps of:

depositing a first insulation layer on a substrate;

depositing a first metal layer on the first insulation layer;

depositing a second insulation layer on the first metal layer;

depositing a second metal layer on the second insulation layer;

patterning the second metal layer into a form;

depositing a third insulation layer on the second insulation layer and the second metal layer;

opening in the second and third insulation layers holes spaced from the second metal layer by a distance and reaching the first metal layer;

depositing selectively a metal comprising aluminum by a CVD method utilizing alkylaluminium hydride and hydrogen with the substrate maintained at a temperature higher than the decomposition temperature of the alkylaluminum gas and lower than 450° C. to fill the holes;

depositing non-selectively a metal on the third insulation film and the metal comprising aluminum; and patterning the metal.

10. A method according to claim 9, wherein said selective deposition of the metal comprising aluminum is performed within a first chamber, and then the substrate is moved into a second chamber without exposing the substrate to the atmosphere, and said non-selective deposition of the metal film is performed within the second chamber.

11. A method according to claim 9, wherein the aperture has an aspect ratio greater than or equal to 1.5.

12. A method according to claim 9, wherein the selectively deposited metal comprising aluminum is selected from the group consisting of Al, Al-Si, Al-Ti, Al-Cu, Al-Si-Ti, and Al-Si-Cu.

13. A method according to claim 9, wherein the non-selectively deposited metal is selected from the group consisting of Al, Al-Si, Al-Ti, Al-Cu, Al-Si-Ti, and Al-Si-Cu.

* * * * *

UNITED STATES PATENT AND TRADEMARK OFFICE
CERTIFICATE OF CORRECTION

PATENT NO. : 5,614,439

DATED : March 25, 1997

INVENTORS : FUMIO MUROOKA ET AL.

It is certified that error appears in the above-identified patent and that said Letters Patent is hereby corrected as shown below:

ON TITLE PAGE

[56] References Cited - FOREIGN PATENT DOCUMENTS

"1194440" should read --1-194440--;
"1248643" should read --1-248643--.

OTHER PUBLICATIONS:

"IEEE Frans." should read --IEEE Trans.--.

COLUMN 1

Line 23, "Initially" should read --Initially,--;
Line 62, "overlapping" should read --overlapping,--.

COLUMN 2

Line 17, "10" should be deleted;
Line 29, "how, the" should read --The--;
Line 44, "connected" should be deleted and "and" should read --an--;
Line 51, "of" should be deleted.

UNITED STATES PATENT AND TRADEMARK OFFICE
CERTIFICATE OF CORRECTION

PATENT NO. : 5,614,439

DATED : March 25, 1997

INVENTORS : FUMIO MUROOKA ET AL.

It is certified that error appears in the above-identified patent and that said Letters Patent is hereby corrected as shown below:

COLUMN 3

Line 25, "through holes" should read --through-holes--;
Line 43, "Also" should read --Also,--;
Line 47, "through hole 209" should read --through-hole 209--.

COLUMN 4

Line 37, "film" should read --films--;
Line 41, "methods" should read --metals--;
Line 46, "an" should read --as--;
Line 48, "said" should read --the--;
Line 49, "said" should read --the--.

COLUMN 5

Line 21, "$X10^{31\ 7}$" should read --$X10^{-7}$--;
Line 24, "10" should be deleted.

COLUMN 6

Line 8, "Also" should read --Also,--;
Line 52, "thus" should read --this--.

UNITED STATES PATENT AND TRADEMARK OFFICE
CERTIFICATE OF CORRECTION

PATENT NO. : 5,614,439

DATED : March 25, 1997

INVENTORS : FUMIO MUROOKA ET AL.

It is certified that error appears in the above-identified patent and that said Letters Patent is hereby corrected as shown below:

COLUMN 7

Line 5,   "However" should read --However,--.

COLUMN 8

Line 5,   "formation" should read --formation,--;
  Line 6,   "etc." should read --etc.,--.

COLUMN 9

Line 50, "Now the" should read --The--.

COLUMN 10

Line 6,   "details" should read --detail--;
  Line 63, "10" should be deleted.

COLUMN 13

Line 27, "phosphor-doped" should read --phosphorous-doped--;
  Line 35, "(T-Sin)" should read --(T-SiN)--.

UNITED STATES PATENT AND TRADEMARK OFFICE
CERTIFICATE OF CORRECTION

PATENT NO. : 5,614,439

DATED : March 25, 1997

INVENTORS : FUMIO MUROOKA ET AL.

It is certified that error appears in the above-identified patent and that said Letters Patent is hereby corrected as shown below:

COLUMN 14

Line 63, "following" should read --the following--.

COLUMN 15

Line 58, "same" should read --the same--.

COLUMN 16

Line 15, "through hole," should read --through-hole,--.

COLUMN 17

Line 16, "10" should be deleted;
   Line 27, "said" should read --the--;
   Line 56, "same" should read --the same--.

COLUMN 18

Line 30, "parasite" should read --parasitic--.

COLUMN 19

Line 35, "Said" should read --The--;
   Line 39, "phosphor)." should read --phosphorous).--;
   Line 41, "However" should read --However,--.

UNITED STATES PATENT AND TRADEMARK OFFICE
CERTIFICATE OF CORRECTION

PATENT NO. : 5,614,439

DATED : March 25, 1997

INVENTORS : FUMIO MUROOKA ET AL.

It is certified that error appears in the above-identified patent and that said Letters Patent is hereby corrected as shown below:

COLUMN 20

Line 21, "Furthermore" should read --Furthermore,--.

COLUMN 22

Line 7,  "alkylaluminium" should read --alkylaluminum--;
  Line 14, "film" should read --layer--.

Signed and Sealed this

Twenty-first Day of October 1997

Attest:

BRUCE LEHMAN

Attesting Officer     Commissioner of Patents and Trademarks